United States Patent
Kobayashi et al.

(10) Patent No.: US 7,184,358 B2
(45) Date of Patent: Feb. 27, 2007

(54) SEMICONDUCTOR MEMORY

(75) Inventors: Hiroyuki Kobayashi, Kawasaki (JP); Tatsuya Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 38 days.

(21) Appl. No.: 10/975,852

(22) Filed: Oct. 29, 2004

(65) Prior Publication Data

US 2005/0105322 A1    May 19, 2005

(30) Foreign Application Priority Data

Oct. 30, 2003 (JP) ............................. 2003-370589
Jun. 29, 2004 (JP) ............................. 2004-191947

(51) Int. Cl.
*G11C 8/00* (2006.01)

(52) U.S. Cl. ............................... 365/230.06

(58) Field of Classification Search .......... 236/230.06; 365/149
See application file for complete search history.

(56) References Cited

U.S. PATENT DOCUMENTS

| | | | |
|---|---|---|---|
| 5,323,354 A | 6/1994 | Matsumoto et al. | |
| 5,617,369 A | 4/1997 | Tomishima et al. | |
| 5,656,946 A | 8/1997 | Sim | |
| 5,659,517 A * | 8/1997 | Arimoto et al. | 365/226 |
| 5,701,143 A | 12/1997 | Rao | |
| 5,901,101 A | 5/1999 | Suzuki et al. | |
| 6,330,173 B1 | 12/2001 | Yamasaki et al. | |
| 6,442,095 B1 | 8/2002 | Ooishi | |
| 6,459,650 B1 | 10/2002 | Lin | |
| 6,487,136 B2 * | 11/2002 | Hidaka | 365/222 |
| 6,512,705 B1 | 1/2003 | Koelling et al. | |
| 6,947,347 B2 * | 9/2005 | Fujioka | 365/227 |
| 2003/0063509 A1 | 4/2003 | Yamasaki | |
| 2003/0103403 A1 | 6/2003 | Tsujino | |
| 2004/0151050 A1 * | 8/2004 | Ooishi | 365/226 |
| 2005/0105372 A1 * | 5/2005 | Kanda | 365/230.06 |

FOREIGN PATENT DOCUMENTS

| | | |
|---|---|---|
| EP | 1 528 572 A | 5/2005 |
| JP | 7-287980 | 10/1995 |
| JP | 2003-77273 | 3/2003 |

* cited by examiner

*Primary Examiner*—Amir Zarabian
*Assistant Examiner*—Anthan Tran
(74) *Attorney, Agent, or Firm*—Arent Fox, LLP

(57) ABSTRACT

A boost voltage generator generates a boost voltage as a high-level voltage of word lines. First word decoders output a low-level voltage or the high-level voltage according to a first address signal in an active period, and outputs the high-level voltage in a standby period. A switch circuit connects a high-level voltage line for supplying the high-level voltage to the first word decoders, with a boost voltage line in the active period, and connects the same with an internal voltage line in the standby period. The internal voltage line is supplied with a voltage lower than the boost voltage. Word drivers supply the boost voltage to the word lines when the gates of their transistors receive the low-level voltage from the first word decoders, and output the low-level voltage to the word lines when the gates thereof receive the high-level voltage from the first word decoders.

18 Claims, 25 Drawing Sheets

| programming state | voltage of RDDRV | | | | | operating specification (product specification) |
|---|---|---|---|---|---|---|
| | normal operation mode | | self refresh mode | | power-down mode | |
| | ACT | STB | ACT | STB | | |
| SET11="L" | VPP | VPP | VPP | VPP | VPP | second specification |
| SET10="L" | VPP | VII | VPP | VII | VII | |
| SET01="L" | VPP | VPP | VPP | VII | VPP | first specification |
| SET00="L" | VPP | VPP | VPP | VPP | VII | |

Fig. 18

SEMICONDUCTOR MEMORY

CROSS REFERENCE TO RELATED APPLICATION

This application is based upon and claims the benefit of priority from Japanese Patent Application No. 2003-370589, filed on Oct. 30, 2003, and No. 2004-191947, filed on Jun. 29, 2004, the entire contents of which are incorporated herein by reference.

BACKGROUND OF THE INVENTION

1. Field of the Invention

The present invention relates to a semiconductor memory which has dynamic memory cells and word lines connected to the memory cells, and supplies a voltage higher than a power supply voltage to the word lines in accessing the memory cells.

2. Description of the Related Art

Recently, semiconductor memories having dynamic memory cells (DRAMs or pseudo SRAMs) have been used for work memories to be mounted on portable equipment such as a cellular phone. Since DRAM memory cells are smaller than SRAM memory cells, the use of DRAMs allows a reduction in product cost. In the meantime, semiconductor memories to be mounted on portable equipment require low power consumption for the sake of extending operating time of the battery. With cellular phones in particular, lower standby currents are of importance in order to extend available standby time. DRAMs and pseudo SRAMs need to perform periodic refresh operations on their memory cells even while the portable equipment is not in operation, and these refresh operations contribute to increases in standby currents. Thus, various contrivances for reducing the standby current have been made to DRAMs and pseudo SRAMs.

For example, there has been proposed a technology in which the operation of a boost voltage generator for generating a boost voltage of word lines is stopped during a self-refresh mode, and the output node (boost node) of the boost voltage generator is fixed to an external supply voltage (disclosed in for example, Japanese Unexamined Patent Application Publication No. Hei 7-287980; hereinafter, referred to as Reference 1). There has also been proposed a technology in which the operation of the boost voltage generator is stopped for a predetermined period after the completion of a refresh operation (a concentrated refresh operation during a self-refresh mode), and the word lines are grounded in this period (disclosed in, for example, Japanese Unexamined Patent Application Publication No. 2003-77273; hereinafter, referred to as Reference 2).

Now, in semiconductor memories having dynamic memory cells, the selection voltage of the word lines is set to a boost voltage higher than the power supply voltage so that the charges of data retained in the memory cells is made greater for improving read margins. Transistors supplied with the boost voltage at their gates are likely to have gate induced drain leakage (GIDL) currents. Since the GIDL currents flow between the drains and substrates of the transistors or between the sources and substrates of the same depending on the gate voltages, they increase as the gate voltages increase. In the semiconductor memories of this type, serious problems have thus occurred due to GIDL-based increases in the standby currents of transistors inside word drivers especially if the transistors receive the boost voltage at their gates. In particular, in the case of pMOS transistors that receive the boost voltage at their gates, the boost voltage is supplied to the substrates (wells). This increases the voltage differences between the drains and the substrates or the voltage differences between the sources and the substrates, causing greater GIDL currents easily.

For instance, a pMOS transistor under a gate voltage (boost voltage) of 3.2 V produces a GIDL current per gate width (for example, $1\times10^{-11}$ A/μm) which is approximately 50 times larger than the GIDL current under a gate voltage (power supply voltage) of 1.8 V (for example, $2\times10^{-13}$ A/μm). Assuming a pseudo SRAM in which the pMOS transistors in the word drivers receive the boost voltage (3.2 V) at their gates and have a total gate width of approximately $1\times10^{6}$ μm, the GIDL currents of these pMOS transistors sum up to approximately 10 μA.

In addition, GIDL lowers the substrate voltage (boost voltage) of the pMOS transistors. Thus, the boost voltage generator for generating the boost voltage must operate to compensate for the falling-down in voltage. In general, boost voltage generators generate boost voltages by pumping up their coupling capacitors. In a boost voltage generator in single-stage configuration for generating the boost voltage with a single coupling capacitor, the generation efficiency of the boost voltage is on the order of 40–50%. In a boost voltage generator in two-stage configuration for generating the boost voltage with two coupling capacitors, the generation efficiency of the boost voltage is on the order of 20–25%. Recently, the external supply voltage has been decreasing because of transistor miniaturization, and semiconductor memories implementing boost voltage generators of two-stage configuration are on the increase. Assuming that the boost voltage generators of two-stage configuration have an efficiency of generation of 20%, GIDL of 10 μA must be compensated by consuming five times as much current, or 50 μA. Since typical DRAMs have a specification of 100–200 μA in standby current, the effect of GIDL on the standby current is not negligible.

Meanwhile, setting nMOS transistors to a negative substrate voltage requires a negative voltage generator. The efficiency of generation thereof is on the order of 75–80%, however. Consequently, the amount of an increase in current consumption ascribable to GIDL occurring in the nMOS transistors is smaller than that of an increase in current consumption ascribable to GIDL occurring in the pMOS transistors.

There has been no conventional technology for avoiding the occurrence of GIDL in the transistors receiving a boost voltage at their gates in a semiconductor memory that has dynamic memory cells and is supplied with the boost voltage for word lines.

In the foregoing Reference 1, the boost voltage generator stops during the self-refresh mode, and the voltage of the supply line of the boost voltage is forcefully set at the power supply voltage. In performing a refresh operation, it is thus necessary to postpone the operation of selecting the word lines until the boost voltage comes to a predetermined voltage. This means deterioration in performance of the pseudo SRAM. Besides, the next memory access after the stop of the boost voltage generator has to start after the boost voltage generator restarts operation and the boost voltage rises to a predetermined value. As a result, if the Reference 1 is applied to a pseudo SRAM in which a conflict can occur between access requests (read request and write request) and a refresh request, it takes a long time to make the first access after a refresh. This leads to deterioration in performance of the pseudo SRAM since the access time in the product specification has to be set to the worst value.

The foregoing Reference 2 is applicable only during the self-refresh mode for performing a concentrated refresh operation. For example, if the Reference 2 is applied to a DRAM which performs distributed refresh operations during the self-refresh mode, the standby current cannot be reduced satisfactorily due to a decrease in the stop period of the boost voltage generator and an increase in the frequency of stops and restarts thereof. Moreover, if the Reference 2 is applied to a pseudo SRAM in which a conflict can occur between memory access requests and a refresh request, and to a DRAM in which refresh requests are supplied from exterior at arbitrary timing, it takes a long time to make the first memory access after a refresh as with the Reference 1.

SUMMARY OF THE INVENTION

It is an object of the present invention to reduce the GIDL of transistors that receive the boost voltage at their gates.

Another object of the present invention is to reduce the standby current of a semiconductor memory having dynamic memory cells without stopping the boost voltage generator thereof.

Still another object of the present invention is to reduce the standby current without an increase in access time.

According to one of the aspects of the semiconductor memory of the present invention, a memory array has a plurality of dynamic memory cells connected to a plurality of word lines, respectively. A boost voltage generator generates a boost voltage as a high-level voltage of the word lines by using an external supply voltage, the boost voltage being higher than the external supply voltage. A plurality of first word decoders decode a first address signal in an active period for which the memory cells are accessed in response to an access request and a refresh request, output a low-level voltage when the first address signal indicates selection, and output a high-level voltage when the first address signal indicates deselection. The first word decoders also output the high-level voltage in a period excluding the active period, or a standby period.

While in operation in a first specification, a switch circuit connects a high-level voltage line for supplying the high-level voltage to the first word decoders, with a boost voltage line in a first period including at least the active period, and connects the same with an internal voltage line in a period excluding the first period. The boost voltage line is an output node of the boost voltage generator. The internal voltage line is supplied with a voltage lower than the boost voltage. A plurality of word drivers are formed in correspondence with the word lines, respectively, and provided with a transistor each. The word drivers output the boost voltage to the word lines when the gates of the transistors receive the low-level voltage from the first word decoders, and output the low-level voltage to the word lines when the gates thereof receive the high-level voltage from the first word decoder.

According to this semiconductor memory, during the period excluding the first period the first word decoders output the voltage lower than the boost voltage as the high-level voltage according to the switching operation of the switch circuit in the standby period. The gates of the transistors of the word drivers thus receive the voltage lower than the boost voltage during the period excluding the first period. As a result, the gate induced drain leakage currents occurring from the transistors of the word drivers during the standby period can be reduced greatly as compared to the case where the gates receive the boost voltage. That is, it is possible to reduce the standby current of the semiconductor memory significantly.

According to another aspect of the semiconductor memory of the present invention, the word drivers have respective CMOS inverters for inverting the output levels of the first word decoders and outputting the resultant to the word lines, respectively. The transistor of each of the word drivers is a pMOS transistor being a constituent of each of the CMOS inverters.

According to this semiconductor memory, the voltage lower than the boost voltage is supplied as the high-level voltage to the gates of the pMOS transistors of the word drivers in the standby period. Nevertheless, since the gate voltage is lower than the boost voltage, it is possible to avoid the occurrence of gate induced drain leakage.

According to another aspect of the semiconductor memory of the present invention, the first period is the active period and the period excluding the first period is the standby period. A second word decoder decodes a second address signal in the active period. The second word decoder outputs the boost voltage to the sources of the pMOS transistors when the second address signal indicates selection, and outputs the low-level voltage to the sources when the second address signal indicates deselection. At the beginning of the active period, the second word decoder outputs the boost voltage after the switch circuit switches the voltage line to connect with the high-level voltage line from the internal voltage line to the boost voltage line.

According to this semiconductor memory, at the beginning of the active period, the source voltage of the pMOS transistors changes from the low-level voltage to the boost voltage after the gate voltage of the pMOS transistors changes from a voltage lower than the boost voltage to the boost voltage. Thus, the gate voltage can be prevented from falling down below the source voltage, so that the pMOS transistors and nMOS transistors of the CMOS inverters are prevented from turning on at the same time. As a result, it is possible to avoid a feedthrough current flowing between the sources and drains.

According to another aspect of the semiconductor memory of the present invention, an output of the second word decoder is connected commonly to the sources of the pMOS transistors of a plurality of word drivers.

According to this semiconductor memory, the output of the second word decoder is connected commonly to the sources of the pMOS transistors of a plurality of word drivers. Consequently, the boost voltage output from the second word decoder is supplied not only to a word driver that receives the low-level voltage from the first word decoder to select the word line, but also word drivers that receive at their gates the high-level voltage from the first word decoders to deselect the word lines. Since the sources of the pMOS transistors are supplied with the boost voltage after the high-level voltage from the first word decoders is set to the boost voltage, it is possible to prevent the pMOS transistors and nMOS transistors of word drivers in unselected state from simultaneously turning on at the beginning of the active period. As a result, it is possible to avoid a feedthrough current flowing between the sources and drains.

According to another aspect of the semiconductor memory of the present invention, the first period is the active period and the period excluding the first period is the standby period. A second word decoder decodes a second address signal in the active period. The second word decoder outputs the boost voltage to the sources of the pMOS transistors when the second address signal indicates selection, and outputs the low-level voltage to the sources when the second address signal indicates deselection. At the end of the active period, the switch circuit switches the voltage line to connect with the high-level voltage line from the boost voltage line to the internal voltage line after the second word decoder outputs the low-level voltage.

According to this semiconductor memory, at the end of the active period, the gate voltage of the pMOS transistors changes from the boost voltage to the voltage lower than the boost voltage after the source voltage of the pMOS transistors changes from the boost voltage to the low-level voltage. Thus, the gate voltage can be prevented from falling down below the source voltage, so that the pMOS transistors and nMOS transistors of the CMOS inverters are prevented from turning on at the same time. As a result, it is possible to avoid a feedthrough current flowing between the sources and drains.

According to anther aspect of the semiconductor memory of the present invention, at the end of the active period, the switch circuit switches the voltage line to connect with the high-level voltage line from the boost voltage line to the internal voltage line after the first word decoders change their output voltages from low level to high level.

According to this semiconductor memory, at the end of the active period, the first word decoders supply the boost voltage to the word lines temporarily, and then supply a voltage lower than the boost voltage as the high-level voltage. Consequently, the nMOS transistors of the CMOS inverters of the word drivers are turned on temporarily strongly. It is therefore possible to lower the voltages of the word lines to the deselection level quickly at the end of the active period. As a result, the resetting operation period of the word lines can be shortened with a reduction in access time. It is also possible to prevent the word lines from selected in a multiple way because of insufficient resetting of the word lines when active periods occur consecutively (access requests are supplied consecutively). That is, the semiconductor memory can be prevented from malfunctioning.

According to another aspect of the semiconductor memory of the present invention, an internal power supply voltage generator generates a constant internal supply voltage by using the external supply voltage, the internal supply voltage being lower than the external supply voltage.

According to this semiconductor memory, the constant internal supply voltage generated by the internal power supply voltage generator can be used for the voltage lower than the boost voltage, so that the word drivers are supplied with the high-level voltage with smaller variations.

According to another aspect of the semiconductor memory of the present invention, the boost voltage generator has a comparison control circuit for comparing the boost voltage and a reference voltage, and performing a boost operation during a period when the boost voltage is lower than the reference voltage. The comparison control circuit continues to perform the comparing operation during the active period and the standby period.

According to this semiconductor memory, the comparison control circuit of the boost voltage generator continues the comparing operation not only during the active period but also during the standby period. Nevertheless, the application of the present invention enables a significant reduction in the gate induced drain leakage currents, and the boost voltage (the substrate voltage of the pMOS transistors) thus suffers little drop. Consequently, the frequency at which the boost voltage generator executes boost operations is low even if the comparison control circuit continues the comparing operation during the standby period. As a result, the current consumption of the boost voltage generator can be reduced without forcefully stopping the boost operation of the boost voltage generator during the standby period. That is, it is possible to reduce the standby current without complicated control over the boost voltage generator.

According to another aspect of the semiconductor memory of the present invention, a command decoder decodes a read command and a write command which are the access requests and supplied through an external terminal. A refresh control circuit generates a refresh command, or the refresh request at predetermined intervals. An operation control circuit outputs a timing signal to the memory array in order to perform access operations in response to the read command and the write command, and a refresh operation in response to the refresh command. The operation control circuit has an arbiter for determining the order in which the access operations and the refresh operation are executed when the read command or write command and the refresh command conflict with each other.

According to this semiconductor memory having an arbiter for determining the order in which an access operation and a refresh operation are executed when a read command or write command and a refresh command conflict with each other, it is possible to achieve a significant reduction in gate induced drain leakage current with a reduction in standby current of a semiconductor memory.

According to another aspect of the semiconductor memory of the present invention, a command decoder decodes a read command and a write command which are the access requests and supplied through an external terminal during a normal operation mode. A refresh control circuit generates a refresh command, or the refresh request at predetermined intervals during a self-refresh mode in which none of the access requests is accepted. An operation control circuit outputs a timing signal to the memory array in order to perform access operations in response to the read command and the write command, and a refresh operation in response to the refresh command.

According to this semiconductor memory having a self-refresh mode, it is possible to achieve a significant reduction in gate induced drain leakage current with a reduction in standby current of thereof.

According to another aspect of the semiconductor memory of the present invention, the semiconductor memory has, as operation modes, a normal operation mode in which the access request is accepted and a self-refresh mode in which the access request is not accepted and only a refresh operation is executed in response to the refresh request generated inside the semiconductor memory. The first period (in which the high-level voltage line is connected to the boost voltage line) is the active period in the normal operation mode and the self-refresh mode, and a standby period in the normal operation mode. The period excluding the first period (in which the high-level voltage line is connected to the internal voltage line) is the standby period in the self-refresh mode.

In this semiconductor memory, the switch circuit switches the voltage of the high-level voltage line to the boost voltage line or the internal voltage line only during the self-refresh mode but does not switch the voltage during the normal operation mode. In a system in which memory cells are accessed at a high frequency during the normal operation mode, for example, lowering the switching frequency of the switch circuit lowers the frequency at which the high-level voltage line is alternately connected to the boost voltage line and the internal voltage line. As a result, the frequency at which the high-level voltage line charges/discharges lowers, enabling a reduction in power consumption. The reduction in unnecessary consumption of the boost voltage can reduce unnecessary operations of the boost voltage generator. Since a typical boost voltage generation efficiency of the boost voltage generator is on the order of several tens %, the reduction in unnecessary consumption of the boost voltage produces a significant effect of reducing power consumption.

According to another aspect of the semiconductor memory of the present invention, the semiconductor memory has, as operation modes, a normal operation mode in which the access request and the refresh request are accepted, and a power-down mode in which neither the access request nor the refresh request is accepted. The first period is a period of the normal operation mode and the period excluding the first period is a period of the power-down mode.

In this semiconductor memory, the switch circuit does not switch the voltage of the high-level voltage line except when it switches between the normal operation mode and the power-down mode. Lowering the switching frequency of the switch circuit lowers the frequency at which the high-level voltage line charges/discharges, enabling a reduction in power consumption as described above. In particular, the reduction in unnecessary consumption of the boost voltage produces a significant effect of reducing power consumption.

According another aspect of the semiconductor memory of the present invention, a programming circuit sets an operating specification of the semiconductor memory to either the first specification or a second specification. The switch circuit continues to connect the high-level voltage line to the boost voltage line when a set value of the programming circuit indicates the second specification. That is, the switch circuit does not switch the voltage of the high-level voltage line in the second specification. For example, if a system incorporates a semiconductor memory in which memory cells are accessed at a high frequency and thus the standby current is of less importance therein, the operating specification of the semiconductor memory is set to the second specification. In a system in which memory cells are accessed at a low frequency, the standby current is of great importance so that the operating specification of the semiconductor memory is set to the first specification. The product specification (operating specification) of the semiconductor memory is thus optimally changeable according to the specification of the system.

According to another aspect of the semiconductor memory of the present invention, a mode register sets an operating specification of the semiconductor memory to either the first specification or a second specification. The switch circuit continues to connect the high-level voltage line to the boost voltage line when a set value of the mode register indicates the second specification. That is, the switch circuit does not switch the voltage of the high-level voltage line in the second specification. Therefore, similarly to the aforesaid semiconductor memory having the programming circuit, the operating specification of the semiconductor memory is optimally changeable according to the specification of the system. In addition, making the mode register available to a user, the user can optimally change the product specification (operating specification) of the semiconductor memory.

According to another aspect of the semiconductor memory of the present invention, an operating specification (product specification) of the semiconductor memory is set to either the first specification or a second specification according to a voltage of a destination to which a conductive film is connected. The conductive film is formed at a predetermined position over a semiconductor substrate so as to match with a pattern shape of a photomask used in a semiconductor manufacturing process. The switch circuit continues to connect the high-level voltage line to the boost voltage line when the voltage of the connection destination of the conductive film indicates the second specification. This example also shows that the operating specification of the semiconductor memory is optimally changeable according to the specification of the system.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 18 is an explanatory chart showing operations of the gate control circuit shown in FIG. 17;

DESCRIPTION OF THE PREFERRED EMBODIMENTS

Figure 1:
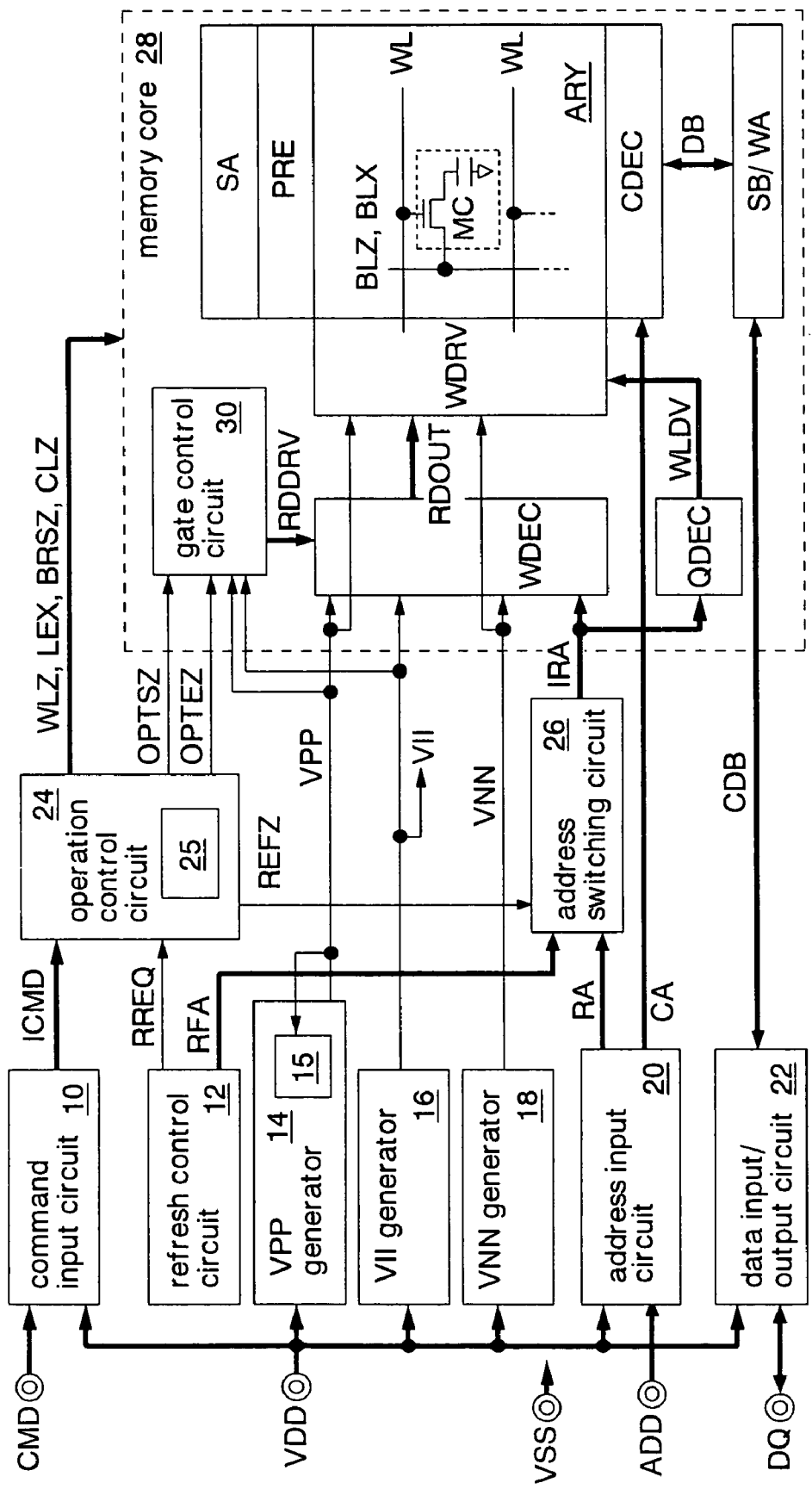
FIG. 1 is a block diagram showing a first embodiment of the semiconductor memory of the present invention.

Hereinafter, embodiments of the present invention will be described with reference to the drawings. Double circles in the drawings represent external terminals. In the drawings, each thick line represents a signal line that consists of a plurality of lines. Some of the blocks connected with the thick lines consist of a plurality of circuits each. Signals supplied through the external terminals are designated by the same reference symbols as the names of the terminals. Signal lines for transmitting the signals are designated by the same reference symbols as the names of the signals. Signals ending in "Z" are of positive logic. Signals ending in "X" are of negative logic.

FIG. 1 shows a first embodiment of the semiconductor memory of the present invention. This semiconductor memory is formed as a pseudo SRAM chip on a silicon substrate by using CMOS processes. The pseudo SRAM has a DRAM memory core and an SRAM interface. The pseudo SRAM performs periodic refresh operations inside the chip without receiving refresh commands from exterior, thereby retaining data written in its memory cells. The pseudo SRAM is used, for example, as a work memory to be mounted on a cellular phone. A read operation and a write operation are performed in accordance with command signals CMD (a read command and a write command) supplied through an external terminal. Note that herein the operating specification of the pseudo SRAM is only one unlike in the fifth to eighth embodiments to be described later. That is, the pseudo SRAM is always operative in the first specification.

The pseudo SRAM has a command input circuit 10, a refresh control circuit 12, a VPP generator 14, a VII generator 16, a VNN generator 18, an address input circuit 20, a data input/output circuit 22, an operation control circuit 24, an address switching circuit 26, and a memory core 28. Incidentally, FIG. 1 only shows essential signals necessary for the description of the present invention. A ground voltage VSS is supplied to most of the circuits except a memory array ARY.

The command input circuit 10 (command decoder) receives command signals CMD (such as a chip enable signal /CE, a write enable signal /WE, and an output enable signal /OE) supplied through a command terminal. The command input circuit 10 decodes the received command signals CMD (a read command and a write command=access requests), and outputs an internal command signal ICMD for operating the memory core 28.

The refresh control circuit 12 has a refresh timer and a refresh address counter which are not shown. The refresh timer outputs a refresh request signal RREQ (refresh command) at predetermined intervals. The refresh address counter executes a counting operation in accordance with the refresh request signal RREQ, and outputs a refresh address signal RFA consisting of a plurality of bits. The refresh address signal RFA is a row address signal for selecting word lines WL to be described later.

The VPP generator 14 has two coupling capacitors and transistors which are diode-connected to these coupling capacitors, respectively. The VPP generator 14 generates a constant boost voltage VPP by using a power supply voltage VDD (external supply voltage) supplied through an external terminal, the constant boost voltage VPP being higher than the power supply voltage. That is, the VPP generator 14 operates as a boost voltage generator of two-stage configuration. The boost voltage VPP is used as a high-level voltage of the word lines WL. The VPP generator 14 has a comparison control circuit 15 for comparing, with a reference voltage, a voltage stepped down from the boost voltage VPP by resistance division, and performing a boost operation during a period when the stepped-down voltage (indicating the boost voltage VPP in relative terms) is lower than the reference voltage VREF. The comparison control circuit 15 continues the comparing operation during an active period for accessing memory cells MC and during a period other than the active period, or a standby period. As will be described later, gate induced drain leakage currents occurring from the pMOS transistors of word drivers WDRV (leakage from VPP to VNN) are almost negligible during the standby period. The operation of the VPP generator 14, even if effected during the standby period, is thus low in frequency, and the VPP generator 14 consumes only a slight current. It is therefore possible to reduce the standby current without forcefully stopping the VPP generator 14 during the standby period, i.e., without complicated control over the VPP generator 14.

The VII generator 16 (internal power supply voltage generator) steps down the power supply voltage VDD to generate a constant internal supply voltage VII. The internal supply voltage VII is supplied to most of the circuits excluding the memory array ARY, the input circuits 10, 20 and the input/output circuit 22 which are connected to the external terminals, and the voltage generators 14, 16, and 18.

The VNN generator 18 (negative voltage generator) has a single coupling capacitor and a transistor which is diode-connected to the coupling capacitor. The VNN generator 18 generates a constant negative voltage VNN by using the power supply voltage VDD and the ground voltage VSS. The negative voltage VNN is used as the low-level voltage of the word lines WL.

The input specification (product specification) of the power supply voltage VDD is determined as 1.65 to 1.95 V, for example. The VPP generator 14 generates the constant boost voltage VPP (for example, 3.2 V) when the power supply voltage VDD falls within the range mentioned above. The VII generator 16 generates the constant internal supply voltage VII (for example, 1.65 V) when the power supply voltage VDD falls within the foregoing range. The VNN generator 18 generates the constant negative voltage VNN (for example, −0.2 V) when the power supply voltage VDD falls within the foregoing range. Essential circuits inside the pseudo SRAM operate with the internal supply voltage VII, the boost voltage VPP, and the negative voltage VNN which are constant irrespective of the power supply voltage VDD. This can avoid deviations in operation timing (a decrease in timing margin) resulting from variations of the power supply voltage VDD. As a result, the pseudo SRAM can be improved in performance with an improvement in yield.

The address input circuit 20 receives an address signal ADD supplied through an address terminal, and outputs the received signal as a row address signal RA and a column address signal CA. The row address signal RA is used to select the word lines WL. The column address signal CA is used to select bit lines BLZ (or BLX).

The data input/output circuit 22, in a read operation, outputs read data transmitted from the memory core 28 through a common data bus CDB to data terminals DQ (of 16 bits, for example). In a write operation, the data input/output circuit 22 receives write data supplied through the data terminals DQ, and transfers the received data to the memory core 28 through the common data bus CDB.

The operation control circuit 24 has an arbiter 25 for determining which of the internal command signal ICMD and the refresh request signal RREQ is given priority, when the two signals input asynchronously conflict with each other. The operation control circuit 24 outputs a refresh signal REFZ when performing a refresh operation in response to a refresh command. Owing to the arbiter 25, the refresh operation is performed between read operations responding to read commands, or between write operations responding to write commands supplied from exterior of the pseudo SRAM. That is, refresh operations are performed automatically inside the pseudo SRAM.

The operation control circuit 24 outputs timing signals for operating the memory array ARY including a word line control signal WLZ, a latch enable signal LEX, and a bit line resetting signal BRSX, in response to the internal command signal ICMD (read command and write command) or the refresh request signal RREQ (refresh command) which the arbiter 25 has determined to give priority to. The operation control circuit 24 also outputs an operation start signal OPTSZ and an operation end signal OPTEZ for indicating the selection start timing and selection end timing of the word lines WL, respectively, in response to the internal command signal ICMD or the refresh request signal RREQ. A timing signal for selecting column switches in the memory core 28, or a column line control signal CLZ, is output in response to only the internal command signal ICMD. The word line control signal WLZ is a timing signal for selecting the word lines WL. The latch enable signal LEX is a timing signal for operating a sense amplifier SA in the memory core 28. The bit line resetting signal BRSX is a timing signal for operating a precharging circuit PRE in the memory core 28.

The address switching circuit 26 outputs the row address signal RA as an internal row address signal IRA while it receives the refresh signal REFZ of low level (during a read operation, a write operation, or a standby period). The address switching circuit 26 outputs the refresh address signal RFA as the internal row address signal IRA while it receives the refresh signal REFZ of high level (during a refresh operation). That is, the row address signal RA supplied from exterior is selected in a read operation, a write operation, and a standby period. In a refresh operation, the refresh address signal RFA generated inside is selected.

The memory core 28 has a gate control circuit 30, a word decoder WDEC, a 1/4 decoder QDEC, a word driver WDRV, a sense amplifier SA, a precharging circuit PRE, the memory array ARY, a column decoder CDEC, a sense buffer SB, and a write amplifier WA.

The gate control circuit 30 sets a row driving signal RDDRV at the boost voltage VPP while the operation start signal OPTSZ or the operation end signal OPTEZ is activated (active period=the first period), and sets the driving signal RDDRV at the internal supply voltage VII when both the operation start signal OPTSZ and the operation end signal OPTEZ are inactivated (standby period=the period excluding the first period). As will be described later, the high-level voltage of the word lines WL is set by the voltage of the row driving signal RDDRV.

The word decoder WDEC (first word decoder) sets a row output signal RDOUT at either a selection level or a deselection level according to a first address signal which consists of high-order bits of the internal row address signal IRA (though excluding those bits to be used for the selection of memory blocks to be described later), and a timing signal (for example, WLZ signal) from the operation control circuit 24. Here, the selection level is set at the negative voltage VNN. The deselection level is set at either the boost voltage VPP or the internal supply voltage VII depending on the voltage of the row driving signal RDDRV.

The 1/4 decoder QDEC (second word decoder) decodes a second address signal which consists of the lower two bits of the internal row address signal IRA. In synchronization with a timing signal (for example, WLZ signal) from the operation control circuit 24, the 1/4 decoder QDEC sets a decoding signal WLDV at a selection level (VPP) if the second address signal indicates selection, and sets the decoding signal WLDV at a deselection level (VNN) if the second address signal indicates deselection.

The word driver WDRV sets the word lines WL at a selection level (VPP) or a deselection level (VNN) according to the row output signal RDOUT and the decoding signal WLDV.

The memory array ARY has a plurality of dynamic memory cells MC arranged in a matrix, as well as a plurality of word lines WL and a plurality of bit line pairs BLZ, BLX which are connected to the memory cells MC. The memory array ARY consists of four memory blocks. The memory cells MC are the same as typical DRAM memory cells, each having a capacitor (memory node) for retaining data in the form of a charge and a transfer transistor arranged between this capacitor and a bit line BL. The gate of the transfer transistor is connected to a word line WL.

The sense amplifier SA operates in synchronization with the latch enable signal LEX, and amplifies voltage differences between the bit lines BLZ and BLX while the latch enable signal LEX is activated (during a low-level period). The precharging circuit PRE operates in synchronization with the bit line resetting signal BRSX, and sets the bit lines BLZ and BLX at a predetermined voltage when the memory core 24 is not in operation.

The column decoder CDEC selects column switches for connecting the bit lines BLZ, BLX and a data bus DB respectively in accordance with the column address signal CA, and turns on the selected column switches in synchronization with the column line control signal CLZ.

The sense buffer SB amplifies the read data on the data bus DB in signal quantity, and outputs the resultant to the common data bus CDB in a read operation. The write amplifier WA amplifies the write data on the common data bus CDB in signal quantity, and outputs the resultant to the data bus DB in a write operation.

Figure 2:
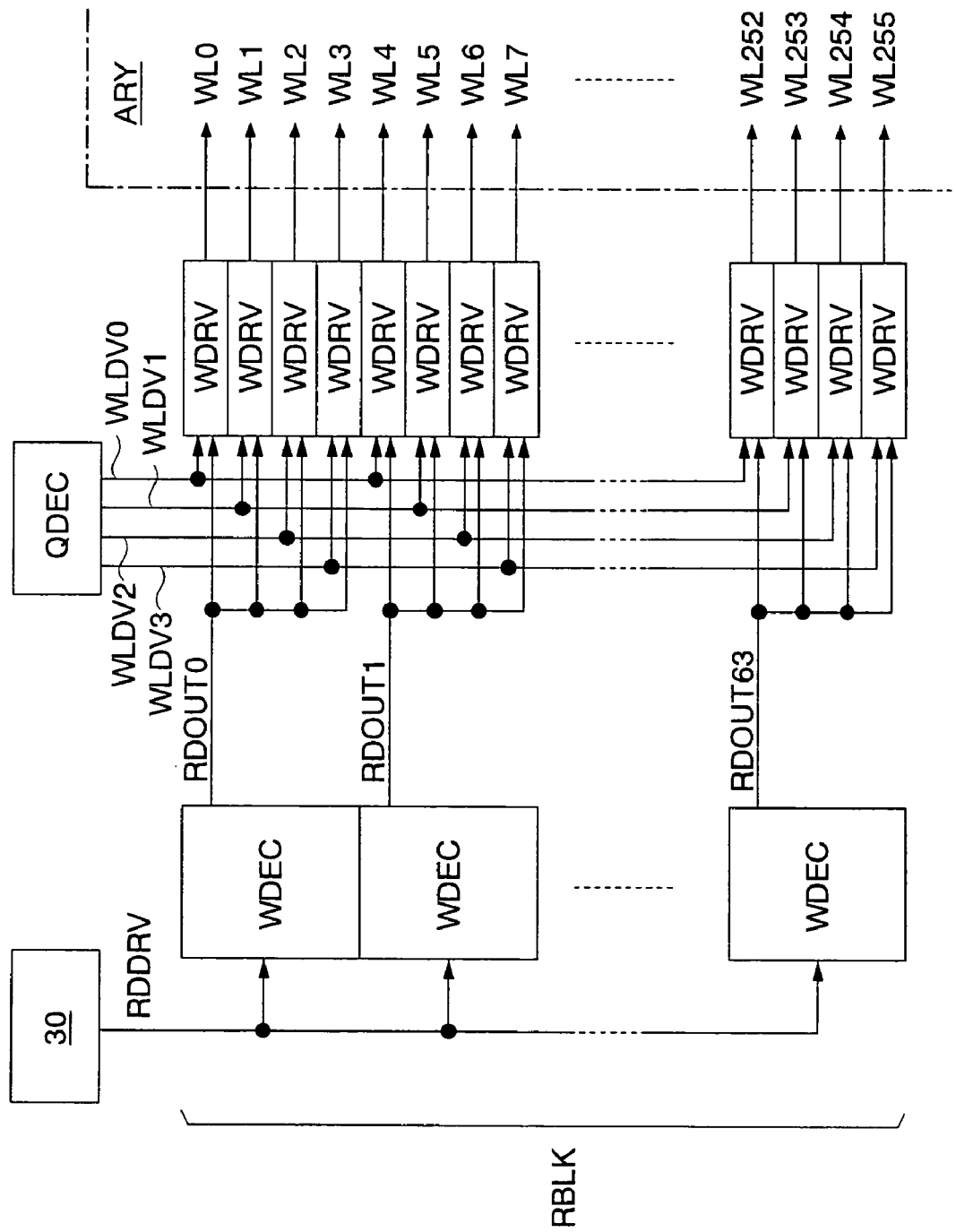
FIG. 2 is a block diagram showing the details of essential parts of the memory core shown in FIG. 1.

FIG. 2 shows the details of essential parts of the memory core 28 shown in FIG. 1. The diagram shows circuits to be connected to a single memory block of the memory array ARY. That is, each memory block has 32 row blocks RBLK. The gate control circuit 30 and the 1/4 decoder QDEC are formed for each of the row blocks RBLK.

The row blocks RBLK have 64 word decoders WDEC and 256 word drivers WDRV each. That is, four word drivers WDRV are formed with respect to each of the word decoders WDEC. In each row block RBLK, the word drivers WDRV are formed in correspondence with 256 word lines WL (WL0, WL1, . . . , WL255), respectively. In a read operation, a write operation, and a refresh operation, any one of the word decoders WDEC is selected with respect to each of the data terminals DQ according to the row address signal RA. The selected word decoders WDEC set their row output signals RDOUT (RDOUT0, RDOUT1, . . . ) at the negative voltage VNN. The unselected word decoders WDEC set their row output signals RDOUT at the boost voltage VPP.

The 1/4 decoder QDEC changes any one of the decoding signals WLDV (WLDV0–3) from the negative voltage VNN to the boost voltage VPP according to the lower two bits of the row address signal (the second address signal). The four decoding signals WLDV are output commonly to a plurality of word drivers WDRV in the row block RBLK. Among the four word drivers WDRV receiving a row output signal RDOUT of negative voltage VNN, a word driver WDRV that receives a decoding signal WLDV set at the boost voltage VPP sets its word line WL at the boost voltage VPP. That is, according to the row address signal RA, a single word driver WDRV is activated for each of the data terminals DQ, selecting a single word line WL. Then, the capacitors of the memory cells MC and the bit lines BLZ (or BLX) are connected to perform a read operation, a write operation, or a refresh operation.

Figure 3:
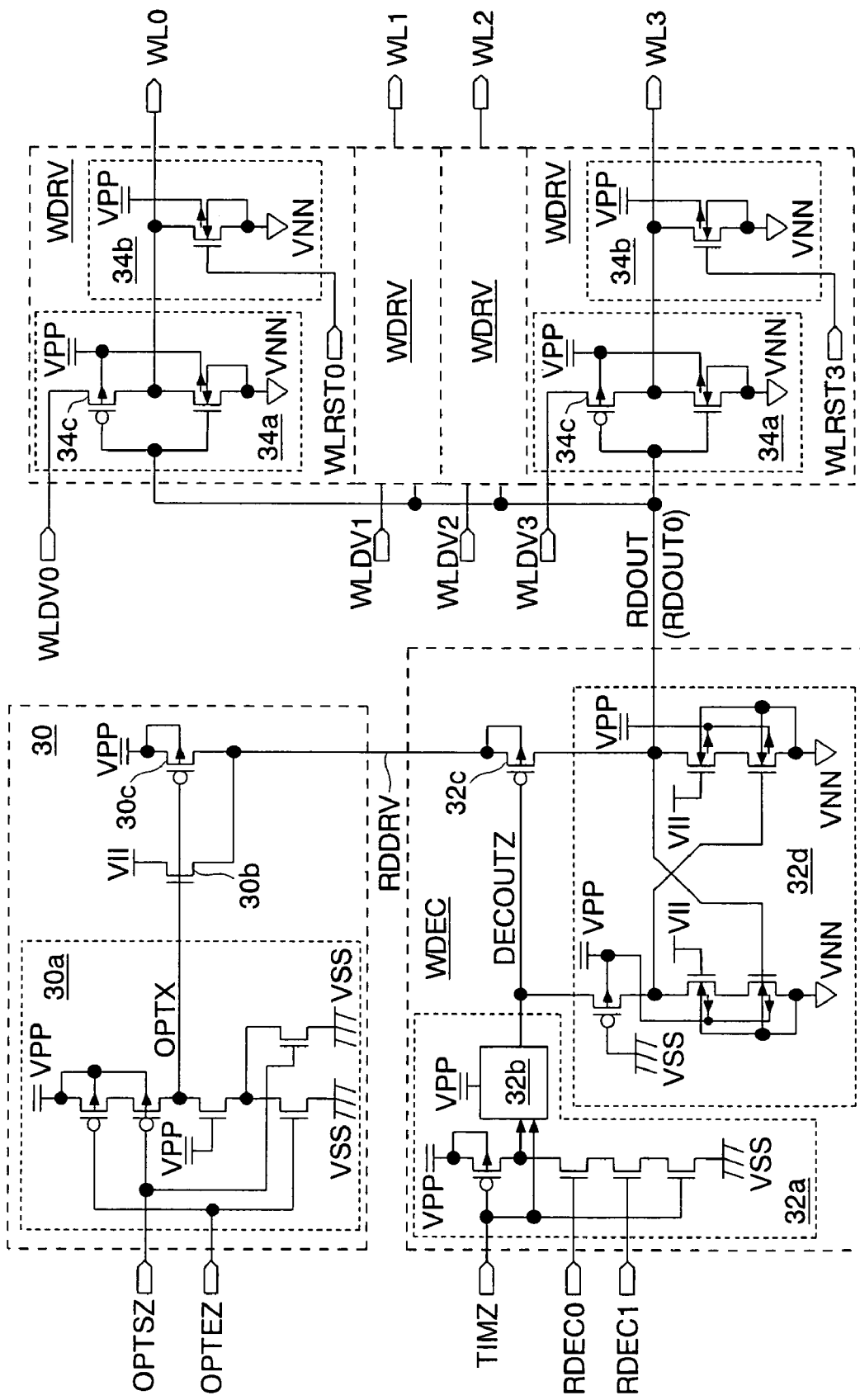
FIG. 3 is a block diagram showing the details of the gate control circuit, the word decoder, and the word driver shown in FIG. 1.

FIG. 3 shows the details of the gate control circuit 30, the word decoder WDEC, and the word driver WDRV shown in FIG. 1. In the diagram, the arrows attached to the transistors are connected to respective well voltages. The nMOS transistors with two opposite arrows have a triple-well structure. The substrate voltages (well voltages) of the nMOS transistors having no arrow are set at the ground voltage VSS.

The gate control circuit 30 includes: a NOR circuit 30a for outputting an operation signal OPTX of low level (VSS) when either the operation start signal OPTSZ or the operation end signal OPTEZ is at high level (VPP); an nMOS transistor 30b for outputting the driving signal RDDRV of high level (VII) when the operation signal OPTX is at high level (VPP); and a pMOS transistor 30c for outputting the driving signal RDDRV of high level (VPP) when the operation signal OPTX is at low level (VSS). The nMOS transistor 30b and the pMOS transistor 30c operate as a switch circuit for connecting the high-level voltage line RDDRV for supplying the high-level voltage to the word decoder WDEC with the boost voltage line VPP in an active period (the first period), and connecting the same with the internal voltage line VII in a standby period (the period excluding the first period), the internal voltage line VII being supplied with the internal supply voltage lower than the boost voltage VPP.

The operation signal OPTX to be supplied to the gate of the pMOS transistor 30c is set at the boost level VPP when both the operation start signal OPTSZ and the operation end signal OPTEZ are at low level (VSS), i.e., during the standby period of the pseudo SRAM. In this situation, however, the source, drain, and substrate of the pMOS transistor 30c are set at the boost voltage VPP, the internal supply voltage VII, and the boost voltage VPP, respectively. This means smaller voltage differences between the substrate and drain and between the substrate and source. Consequently, there hardly flows the gate induced drain current GIDL (or gate induced source current GISL). This eliminates the necessity to deal with GIDL in the pMOS transistor 30c.

The word decoder WDEC includes: a decoding unit 32a having a pMOS transistor and nMOS transistors connected in series between the boost line VPP and the ground line VSS, thereby decoding the row address signal RA; a latch 32b connected to the output of the decoding unit 32a; a pMOS transistor 32c connected to the output node DECOUTZ of the latch 32b at its gate; and a level conversion unit 32d connected to the output node DECOUTZ and the drain of the pMOS transistor 32c. The pMOS transistor 32c sets the level of the row output signal RDOUT at either the internal supply voltage VII or the boost voltage VPP when the output node DECOUTZ is at low level. The level conversion unit 32d sets the level of the row output signal RDOUT at the negative voltage VNN when the output node DECOUTZ is at high level (VPP).

During an active period, the decoding unit 32a outputs a row output signal RDOUTZ in accordance with predecoding signals RDEC (RDEC0–1) of the row address signal RA (first address signal) and a timing signal TIMZ. Specifically, when all the predecoding signals RDEC are at high level, i.e., when the row address signal RA indicates selection, the decoding unit 32a is activated in synchronization with the high-level period of the timing signal TIMZ, thereby turning the output node DECOUTZ to high level (VPP). Here, the word decoder WDEC sets the row output signal RDOUT at the negative voltage VNN (low-level voltage).

During an active period, when any of the predecoding signals RDEC is at low level, i.e., when the row address signal RA indicates deselection, the decoding unit 32a maintains the output node DECOUTZ at low level (VSS). Here, the word decoder WDEC sets the row output signal RDOUT at the boost voltage VPP (high-level voltage).

Moreover, during a standby period of the pseudo SRAM, the output nodes DECOUTZ of all the decoding units 32a are maintained at low level (VSS). Here, the word decoders WDEC set their row output signals RDOUT at the internal supply voltage VII (high-level voltage) which is the same as the voltage of the driving signal RDDRV. During the standby period, the gates of the pMOS transistors 32c receive the ground voltage VSS. Thus, it is not necessary to deal with GIDL in the pMOS transistors 32c.

The word drivers WDRV have CMOS inverters 34a for outputting a high level (the VPP level or VII level of the decoding signal WLDV) or a low level (VNN) to the word lines WL (WL0–3), and nMOS transistors 34b for connecting the word lines WL to the negative voltage line VNN according to word resetting signals WLRST (WLRST0–3). The word drivers WDRV supply the boost voltage VPP to the word lines WL when the gates of the pMOS transistors 34c receive the negative voltage VNN (low-level voltage) from the word decoder WDEC, and output the negative voltage VNN (low-level voltage) to the word lines WL when the gates receive the boost voltage VPP or the internal supply voltage VII (both of which are high-level voltages) from the word decoder WDEC.

The word lines WL are fixed to the deselection level (VNN) while the word resetting signals WLRST are at high level (VII). The word resetting signals WLRST are signals which have phases inverse to those of the decoding signals WLDV and are generated inside the respective word drivers WDRV. In the present invention, the gates of the pMOS transistors 34c of the CMOS inverters 34a receive the internal supply voltage VII during the standby period of the pseudo SRAM. This results in a significant reduction of the GIDL currents during the standby period as compared to heretofore (for example, a reduction from $1 \times 10^{-11}$ A/μm to $2 \times 10^{-13}$ A/μm).

In conventional pseudo SRAMs, the sources of the pMOS transistors 32c of the word drivers WDEC are connected directly to the boost line VPP due to the absence of the gate control circuits 30. All the row output signals RDOUT are thus set at the boost voltage VPP during the standby period, and the gates of the pMOS transistors 34c of all the word drivers WDRV are supplied with the boost voltage VPP. The substrates of the pMOS transistors 34c are fixed to the boost voltage VPP. The sources (WLDV) and drains (WL) of the pMOS transistors 34c are individually set at the negative voltage VNN during the standby period. Conventionally, the standby current has thus been increased by 50 µA or so because of the gate induced drain leakage (hereinafter, referred to as GIDL) of the pMOS transistors 34c. In the present invention, the pMOS transistors 34c cause negligibly small GIDL, allowing a reduction in the standby current by approximately 50 µA as compared to heretofore.

Figure 4:
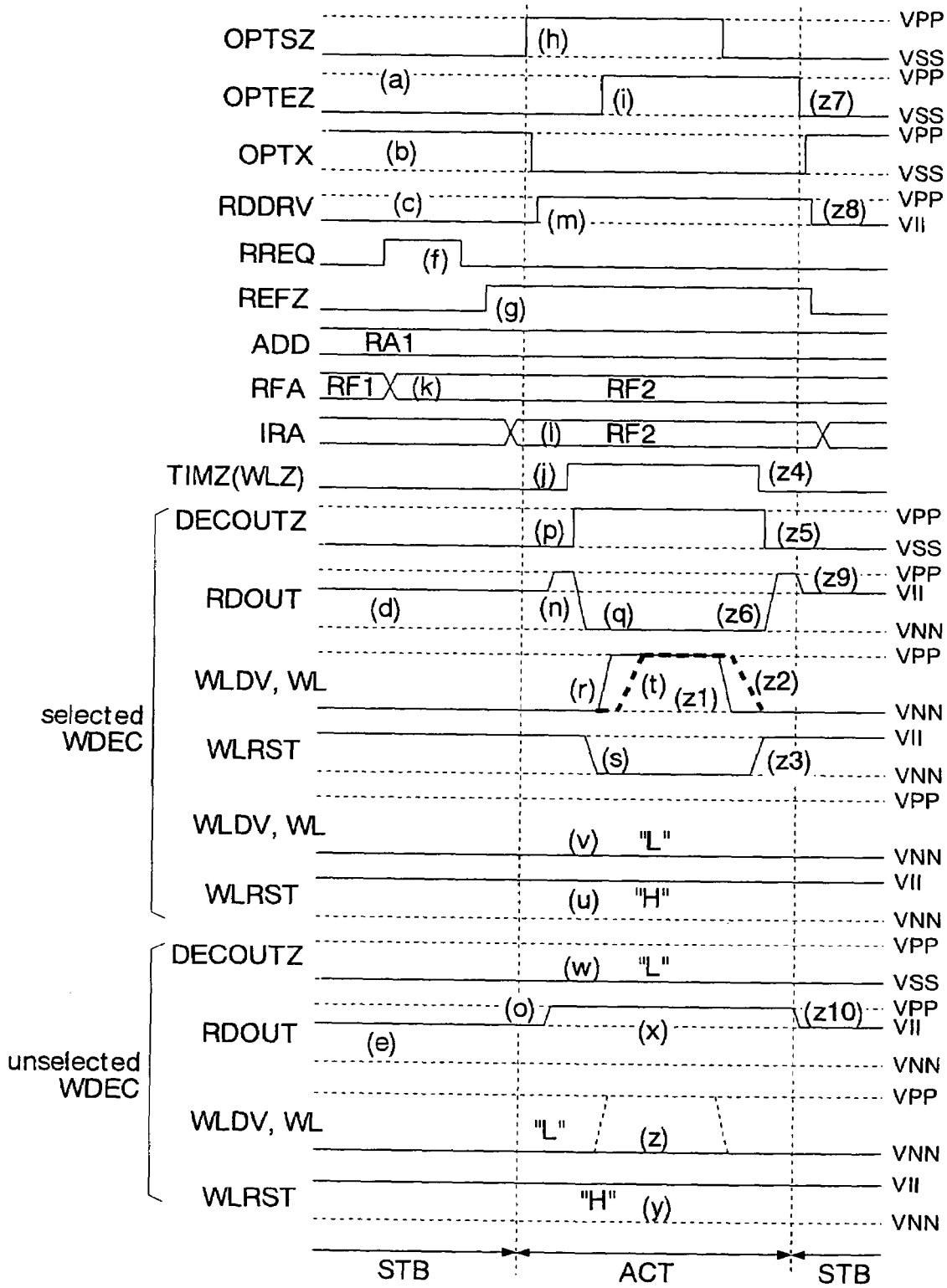
FIG. 4 is a timing chart showing an example where a refresh operation is performed during a standby period of a pseudo SRAM in the first embodiment.

FIG. 4 shows an example where a refresh operation is performed during a standby period of the pseudo SRAM in the first embodiment. The standby periods STB in the diagram show periods in which no external command (read access request or write access command) is supplied, no refresh request occurs inside the pseudo SRAM, and the decoding units 32a of the word decoders WDEC shown in FIG. 3 are inactivated. The active period ACT is a period in which an external command is supplied or a refresh command occurs, and any of the decoding units 32a of the word decoders WDEC are activated.

In a standby period STB, the NOR circuits 30a shown in FIG. 3 receive the operation start signal OPTSZ and operation end signal OPTEZ of low level (VSS) (FIG. 4(a)), and output the operation signals OPTX of high level (VPP) (FIG. 4(b)). The operation signals OPTX of high level turn on the nMOS transistors 30b, so that the driving signals RDDRV are kept at the internal supply voltage VII (FIG. 4(c)). Since the output nodes DECOUTZ of the decoding units 32a are kept at low level during the standby period, the pMOS transistors 32c of the word decoders WDEC turn on. This turning-on keeps the levels of all the row output signals RDOUT at the internal supply voltage VII (FIG. 4(d, e)). Consequently, as described above, the pMOS transistors 34c which receive the row output signals RDOUT at their gates cause little GIDL.

Next, during the standby period, the refresh request signal RREQ is output from the refresh control circuit 12 shown in FIG. 1 (FIG. 4(f)). Since the operation control circuit 24 is receiving no external command, it outputs the refresh signal REFZ, the operation start signal OPTSZ, the operation end signal OPTEZ, the timing signal TIMZ (WLZ), and the not-shown latch enable signal LEX and bit line resetting signal BRSX in response to the refresh request signal RREQ (FIG. 4(g, h, i, j)). The refresh control circuit 12 counts up the refresh address signal RFA in synchronization with the refresh request signal RREQ (FIG. 4(k)). The address switching circuit 26 outputs the refresh address signal RFA (RF2) as the internal row address signal IRA (FIG. 4(l)).

The gate control circuit 30 switches the row driving signal RDDRV from the internal supply voltage VII to the boost voltage VPP while the operation start signal OPTSZ or the operation end signal OPTEZ is at high level (FIG. 4(m)). In the standby period STB, the output nodes DECOUTZ of all the word decoders WDEC are at low level, and the pMOS transistors 32c are on. Thus, all the row output signals RDOUT change from the internal supply voltage VII to the boost voltage VPP in response to the change in the row driving signal RDDRV to the boost voltage VPP (FIG. 4(n, o)). The word decoders WDEC selected by the refresh address signal RFA change the output nodes DECOUTZ of their decoding units 32a to high level (VPP) in synchronization with the timing signal TIMZ (FIG. 4(p)). The selected word decoders WDEC change their row output signals RDOUT to low level (VNN) in response to the changes of the output nodes DECOUTZ (FIG. 4(q)).

The 1/4 decoder QDEC changes one of the decoding signals WLDV (for example, WLDV0) corresponding to the lower two bits of the internal row address signal IRA from low level (VNN) to high level (VPP) (FIG. 4(r)). The word drivers WDRV receiving the decoding signal WLDV of high level inactivate their word resetting signals WLRST in synchronization with the decoding signal WLDV, thereby releasing the reset states of the word lines WL (FIG. 4(s)). Among the four word drivers WDRV receiving a row output signal RDOUT of low level, a word driver WDRV receiving the decoding signal WLDV of high level (VPP) changes the word line WL (for example, WL0) to the boost voltage VPP in synchronization with the decoding signal WLDV as shown by the thick broken line in the diagram, thereby performing a refresh operation (FIG. 4(t)).

At the beginning of the active period ACT, the 1/4 decoder QDEC outputs the boost voltage VPP (the foregoing symbol (r)) after the gate control circuit 30 switches the voltage line to connect with the high-level voltage line RDDRV of the word decoders WDEC from the internal voltage line VII to the boost voltage line VPP (the foregoing symbol (m)). Consequently, the source voltages of the pMOS transistors 34c in the word drivers WDRV change from the negative voltage VNN (low-level voltage) to the boost voltage VPP after the gate voltages of the pMOS transistors 34c are changed from the internal supply voltage VII to the boost voltage VPP. The nMOS transistors that constitute the CMOS inverters together with the pMOS transistors 34c are turned on by receiving the internal supply voltage VII at their gates. Thus, since the gate voltages of the pMOS transistors 34c are prevented from falling down below the source voltages, it is possible to prevent the pMOS transistors and nMOS transistors of the CMOS inverters from turning on at the same time. As a result, it is possible to avoid a feedthrough current flowing between the sources and drains.

Among the four word drivers WDRV receiving a row output signal RDOUT of low level, the three word drivers WDRV receiving the decoding signals WLDV of low level (L; VNN) keep their word resetting signals WLRST at high level (H; VII) (FIG. 4(u)) to keep the word lines WL at the negative voltage VNN (FIG. 4(v)). Consequently, no refresh operation will be performed.

The word decoders WDEC not selected by the refresh address signal RFA maintain the output nodes DECOUTZ of their decoding units 32a at low level (L; VSS) (FIG. 4(w)). This turns on the pMOS transistors 32c, whereby the row output signals RDOUT output from the unselected word decoders WDEC are kept at high level (VPP) (FIG. 4(x)). Among the word drivers WDRV receiving the row output signals RDOUT of high level, the word drivers WDRV receiving the decoding signals WLDV of low level keep their word resetting signals WLRST at high level (H; VII) (FIG. 4(y)) to keep the word lines WL at the negative voltage VNN (FIG. 4(z)). Meanwhile, as shown in FIG. 2, the decoding signals WLDV are supplied commonly to a plurality of word drivers WDRV. Thus, there are word drivers WDRV that receive the row output signals RDOUT of high level and the decoding signal WLDV of high level (the broken line around the symbol (z)). Even in these word drivers WDRV, the gate voltages of the pMOS transistors 34c can also be prevented from falling down below the source voltages as described above, thereby avoiding a feedthrough current flowing between the sources and drains.

The 1/4 decoder QDEC changes the decoding signal WLDV to the negative voltage VNN a predetermined time after the change in the decoding signal WLDV to the boost voltage VPP (FIG. 4(z1)). The negative voltage VNN of the decoding signal WLDV is transmitted to the selected word lines WL through the pMOS transistors 34c that are on, so that the word lines WL fall down in voltage gradually (FIG.

4($z2$)). Subsequently, the word resetting signals WLRST change from the negative voltage VNN to the internal supply voltage VII (FIG. 4($z3$)), and the nMOS transistors 34$b$ turn on to reset the word lines WL to the negative voltage VNN quickly with reliability.

In response to a change in the timing signal TIMZ to low level (FIG. 4($z4$)), the word decoders WDEC change the output nodes DECOUTZ to the ground voltage VSS (FIG. 4($z5$)). Here, the operation end signal OPTEZ is maintained at high level, and the row driving signal RDDRV is maintained at the boost voltage VPP. Consequently, the pMOS transistors 32$c$ of the word decoders WDEC turn on, and the row output signals RDOUT change from the negative voltage VNN to the boost voltage VPP (FIG. 4($z6$)).

Due to the changes of the row output signals RDOUT to the boost voltage VPP, the nMOS transistors constituting the CMOS inverters 34$a$ of the word drivers WDRV are turned on temporarily strongly. This makes the resetting operations of the word lines WL faster.

Subsequently, the operation end signal OPTEZ changes to low level (FIG. 4($z7$)), whereby the row driving signal RDDRV is changed from the boost voltage VPP to the internal supply voltage VII (FIG. 4($z8$)). The row output signals RDOUT change from the boost voltage VPP to the internal supply voltage VII in response to the change in the row driving signal RDDRV (FIG. 4($z9$, $z10$)). Then, the active period ACT ends and a standby period STB restarts. As above, at the end of the active period ACT, the output nodes DECOUTZ of the word decoders WDEC are changed to low level and the row output signals RDOUT are changed from low level to high level before the row driving signal RDDRV is changed from the boost voltage VPP to the internal supply voltage VII. The nMOS transistors constituting the CMOS inverters 34$a$ of the word drivers WDRV can thus be turned on temporarily strongly. It is therefore possible to lower the voltages of the word lines WL to the deselection level quickly with reliability at the end of the active period ACT. As a result, the resetting operation period of the word lines WL can be shortened with a reduction in access time. It is also possible to prevent the word lines from multiple selection because of insufficient resetting of the word lines WL when active periods ACT occur consecutively (when access requests are supplied consecutively). That is, the pseudo SRAM can be prevented from malfunctioning.

Incidentally, at the end of the active period ACT, the gate control circuit 30 sets the voltage line to connect with the high-level voltage line RDDRV of the word decoders WDEC from the boost voltage VPP to the internal supply voltage VII (the foregoing symbol ($z8$)) after the 1/4 decoder QDEC changes the decoding signal WLDV to the negative voltage VNN (the foregoing symbol ($z1$)). The gate voltages of the pMOS transistors 34$c$ thus change from the boost voltage VPP to the internal supply voltage VII after the source voltages of the pMOS transistors 34$c$ are changed from the boost voltage VPP to the negative voltage VNN. Thus, the gate voltages of the pMOS transistors 34$c$ can be prevented from falling down below the source voltages, so that the pMOS transistors and nMOS transistors of the CMOS inverters are prevented from turning on at the same time. As a result, it is possible to avoid a feedthrough current flowing between the sources and drains.

Figure 5:
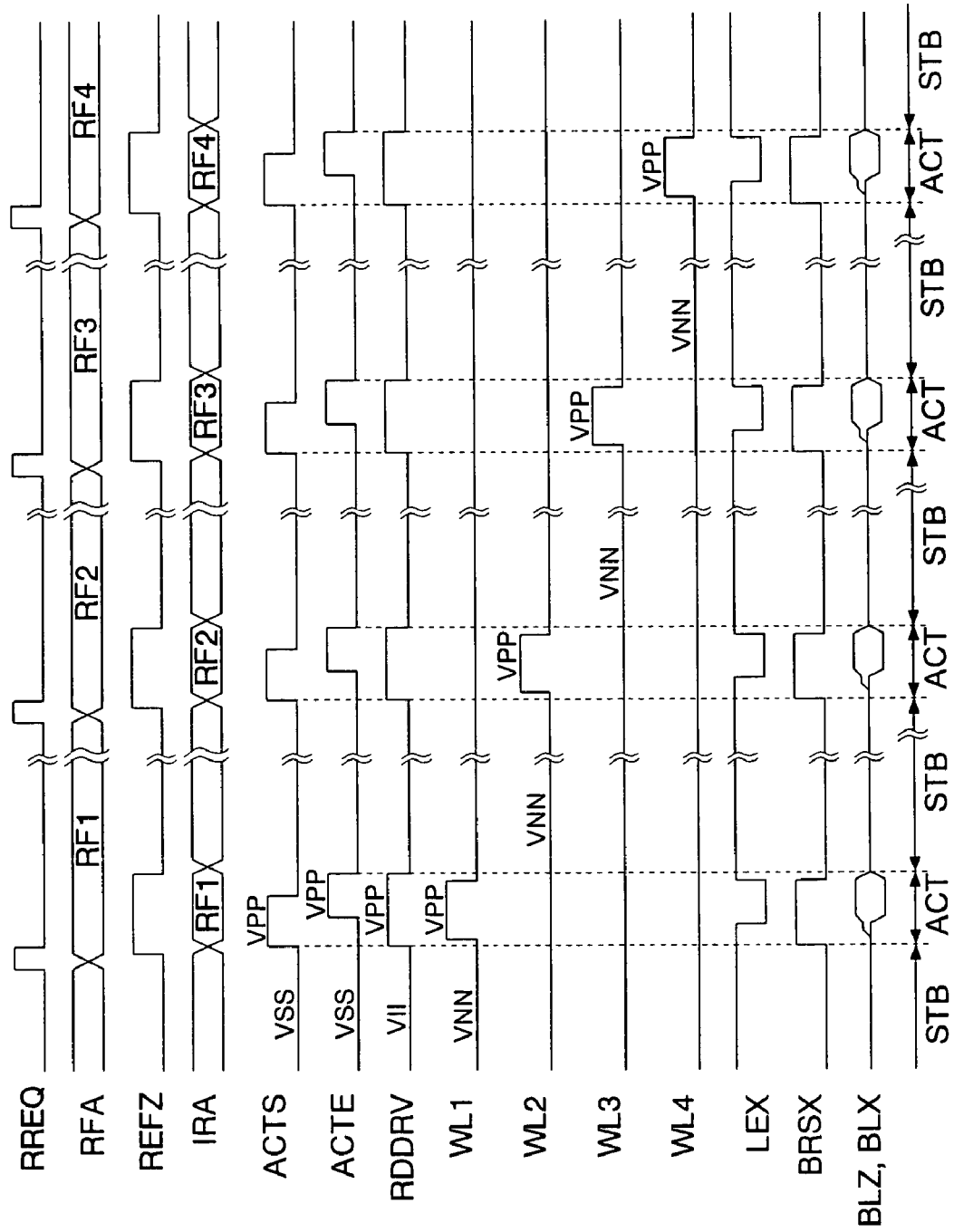
FIG. 5 is a timing chart showing an overview of operations during standby periods of the pseudo SRAM in the first embodiment.

FIG. 5 shows an overview of operation during standby periods of the pseudo SRAM. While no external command (read request or write request) is supplied, the pseudo SRAM remains in a standby state except when a refresh request occurs. When the refresh request signal RREQ occurs, the pseudo SRAM selects word lines WL corresponding to the refresh address signal RFA and perform a refresh operation as shown in FIG. 4. Here, the bit line resetting signal BRSX and the sense amplifier activating signal LEX are also output.

The refresh request signal RREQ is output, for example, at every 16 μs. A refresh operation corresponding to the refresh request signal RREQ (an active period ACT in the diagram) lasts several tens of nanoseconds (for example, 80 ns). The standby period STB and the active period ACT thus have a ratio of 200:1. Consequently, the reduction of the GIDL currents in the standby period STB, which occupies a large proportion of a given period, produces a great effect.

Figure 6:
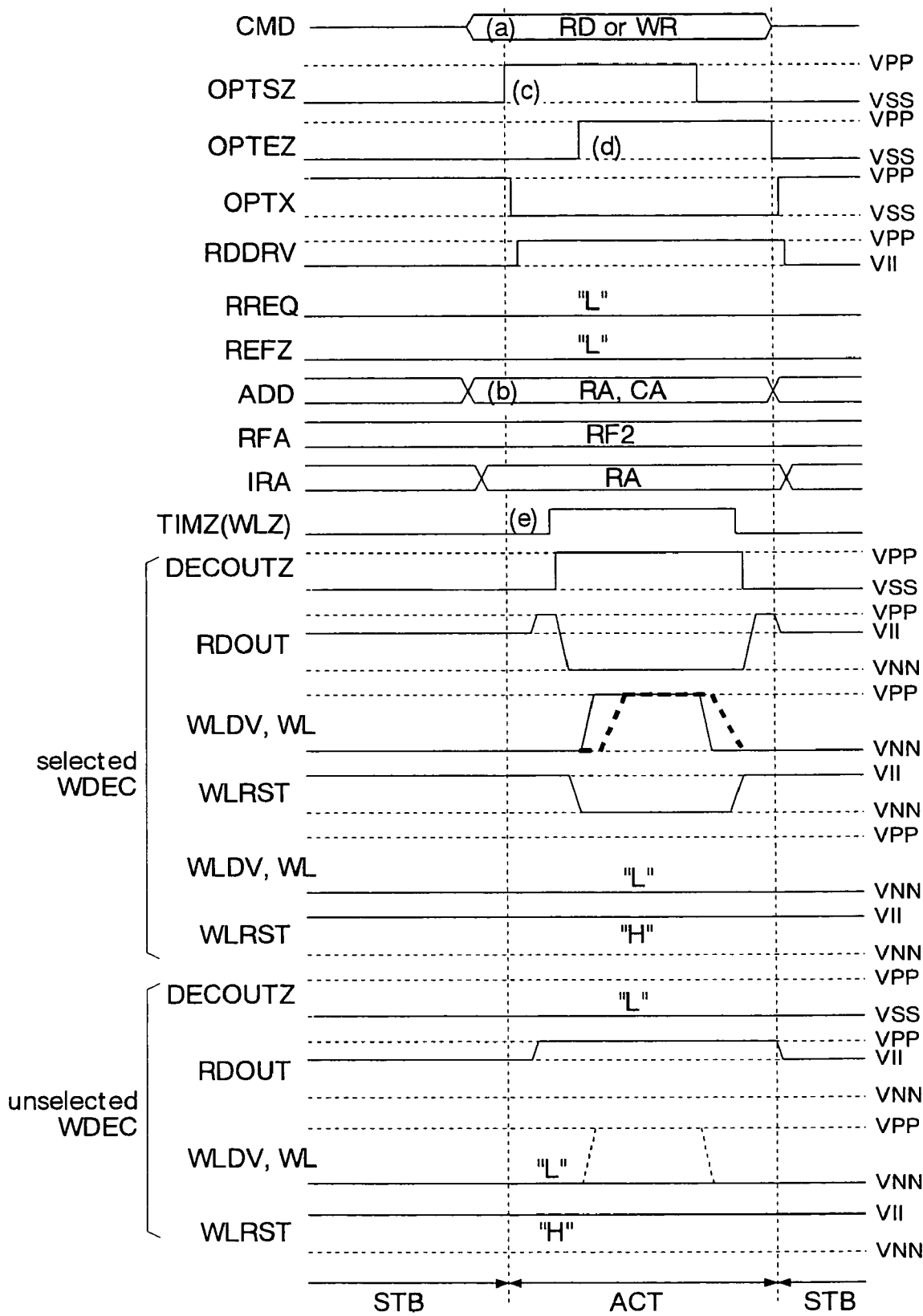
FIG. 6 is a timing chart showing an example where an access operation is performed during a standby period of the pseudo SRAM in the first embodiment.

FIG. 6 shows an example where an access operation (read operation or write operation) is performed during a standby period of the pseudo SRAM in the first embodiment. Detailed description will be omitted of the same operations as in FIG. 4 described above.

A read operation and a write operation are performed when a read command RD and a write command WR are supplied to the command terminal CMD and address signals RA and CA are supplied to the address terminal ADD (FIG. 6($a$, $b$)). The operation control circuit 24 outputs the operation start signal OPTSZ, the operation end signal OPTEZ, the timing signal TIMZ (WLZ), and the not-shown latch enable signal LEX and bit line resetting signal BRSX in response to the internal command signal ICMD (FIG. 6($c$, $d$, $e$)). The subsequent operations are the same as in FIG. 4. As above, even when the pseudo SRAM performs memory accesses in response to the access commands RD and WR, the GIDL currents are reduced in standby periods STB other than the memory accesses as in FIG. 4.

As has been described, according to the present embodiment, the gates of the pMOS transistors 34$c$ of the word drivers WDRV receive the internal supply voltage VII lower than the boost voltage VPP in the standby period STB. Consequently, the gate induced drain leakage currents of the pMOS transistors 34$c$, which occur during the standby period, can be reduced greatly as compared to heretofore. That is, the standby current of the pseudo SRAM can be reduced significantly.

At the beginning and end of the active period ACT, the gate voltages of the pMOS transistors 34$c$ in the word drivers WDRV can be prevented from falling down below the source voltages, so that the pMOS transistors and nMOS transistors of the CMOS inverters are prevented from turning on at the same time. As a result, it is possible to avoid a feedthrough current flowing between the sources and drains.

At the end of the active period ACT, the boost voltage VPP is supplied to the inputs of the CMOS inverters 34$a$ of the word drivers WDRV temporarily, whereby the nMOS transistors of the CMOS inverters 34$a$ can be turned on temporarily strongly. It is therefore possible to lower the voltages of the word lines WL to the deselection level quickly at the end of the active period. As a result, the resetting operation period of the word lines WL can be shortened with a reduction in access time. It is also possible to prevent the word lines WL from multiple selection because of insufficient resetting of the word lines WL when active periods ACT occur consecutively (when access requests are supplied consecutively). That is, the pseudo SRAM can be prevented from malfunctioning.

Since the constant boost voltage VPP generated by the VPP generator 14 and the constant internal supply voltage VII generated by the VII generator 16 are used as the high-level voltages of the driving signals RDDRV, it is possible to supply constant high-level voltages to the word drivers WDRV. As a result, the operation timings and operation margins of the word drivers WDRV can be made uniform.

Since the gate induced drain leakage currents are reduced greatly, the boost voltage VPP (the substrate voltage of the pMOS transistors 34c) suffers little drop. This can reduce the frequency at which the VPP generator 14 performs boost operations. As a result, the standby current can be reduced without stopping the boost operations of the VPP generator 14 during the standby period.

Figure 7:
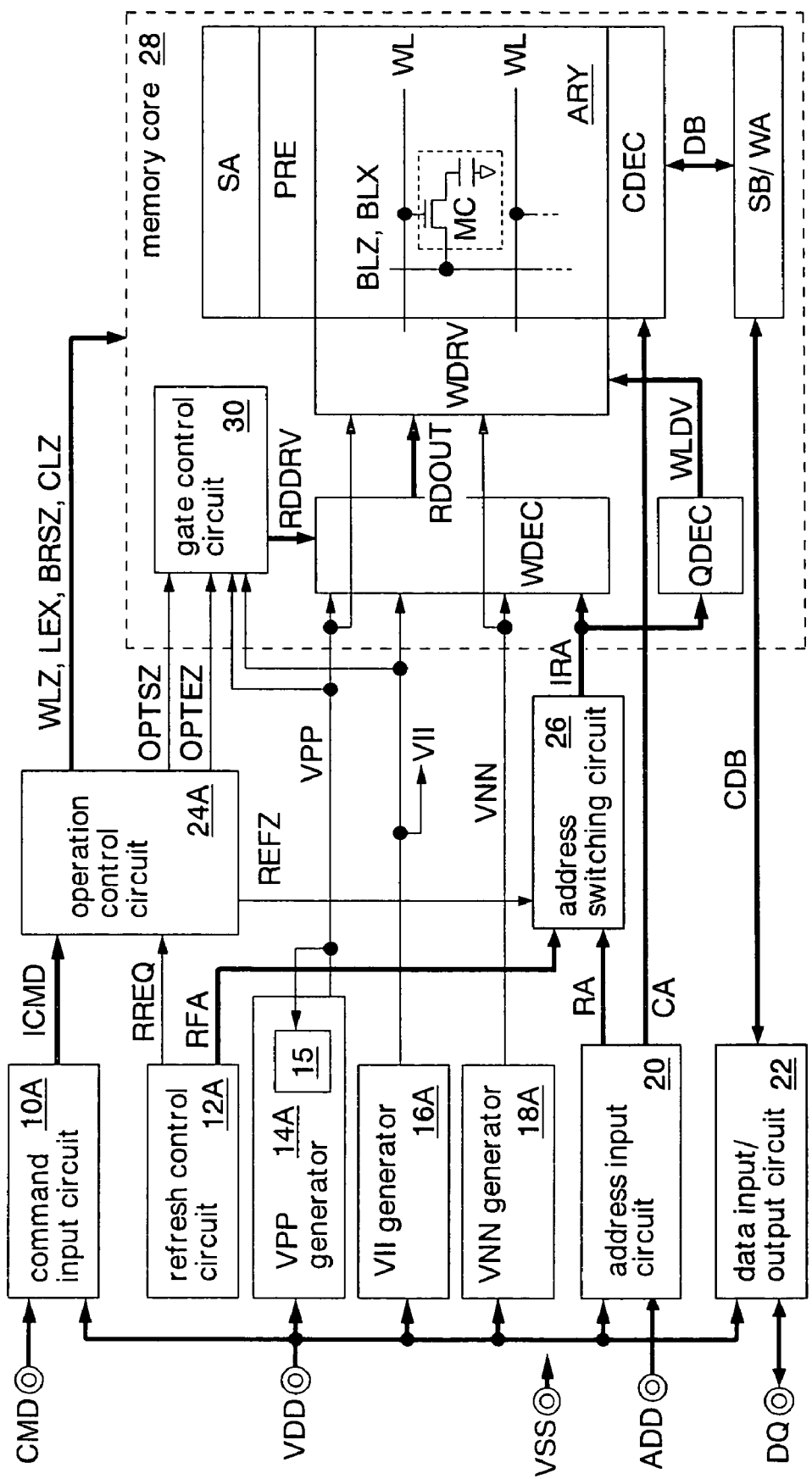
FIG. 7 is a block diagram showing a second embodiment of the semiconductor memory of the present invention.

FIG. 7 shows a second embodiment of the semiconductor memory of the present invention. The same elements as those described in the first embodiment will be designated by identical reference numbers or symbols. Detailed description thereof will be omitted. The semiconductor memory of this embodiment is formed on a silicon substrate by using CMOS processes, as a DRAM having a self-refresh function. The DRAM performs a read operation, a write operation, or a refresh operation (auto refresh) in response to an external command CMD during a normal operation mode. During a self-refresh mode, the DRAM performs a refresh operation in response to a refresh request signal RREQ which a refresh control circuit 12A outputs periodically. The DRAM is used, for example, as a work memory to be mounted on a notebook PC. Note that herein the operating specification of the DRAM is only one as in the first embodiment. That is, the DRAM is always operative in the first specification.

The DRAM has a command input circuit 10A, the refresh control circuit 12A, a VPP generator 14A, a VII generator 16A, a VNN generator 18A, and an operation control circuit 24A instead of the command input circuit 10, the refresh control circuit 12, the VPP generator 14, the VII generator 16, the VNN generator 18, and the operation control circuit 24 of the first embodiment. The rest of the configuration is almost the same as in the first embodiment.

The command input circuit 10A (command decoder) receives command signals CMD (such as a row address strobe signal/RAS, a column address strobe signal/CAS, and a write enable signal/WE) supplied through a command terminal during the normal operation mode. The command input circuit 10A decodes the received command signals CMD (a read command, a write command, an auto refresh command), and outputs an internal command signal ICMD for operating the memory core 28.

The refresh control circuit 12A has a refresh timer and a refresh address counter which are not shown. The refresh timer stops operating during the normal operation mode. During the normal operation mode, the refresh address counter counts up a refresh address signal RFA in response to an auto refresh command signal AREF from the command input circuit 10A. The refresh timer outputs a refresh request signal RREQ (refresh command) at predetermined intervals during the self-refresh mode in which none of the access requests (read command, write command) nor the auto refresh command is accepted. The refresh address counter executes counting operations in accordance with the refresh request signal RREQ, and outputs the refresh address signal RFA.

The VPP generator 14A, the VII generator 16A, and the VNN generator 18A have almost the same functions as those of the VPP generator 14, the VII generator 16, and the VNN generator 18 of the first embodiment.

The operation control circuit 24A outputs timing signals for allowing the memory core 28 to perform a read operation, a write operation, or a refresh operation when it receives a read command, a write command, or a refresh command from the command input circuit 10A during the normal operation mode. The operation control circuit 24A outputs timing signals for allowing the memory core 28 to perform a refresh operation when it receives the refresh request signal RREQ during the self-refresh mode. The operation control circuit 24A executes the same operations as in the first embodiment (FIGS. 4 and 6). Nevertheless, in this embodiment, no conflict will occur between a read request or write request and a refresh request. Accordingly, the operation control circuit 24A has no arbiter.

The gate control circuit 30 operates in the same manner as in the first embodiment. Specifically, the gate control circuit 30 connects the high-level voltage line RDDRV to the boost voltage line VPP in active periods (first period) and connects the same to the internal voltage line VII in standby periods (period excluding the first period).

This embodiment can provide the same effects as those of the first embodiment described above. Besides, in this embodiment, it is possible to reduce GIDL greatly with a reduction in standby current (self-refresh current) even in the DRAM having a self-refresh mode.

Figure 8:
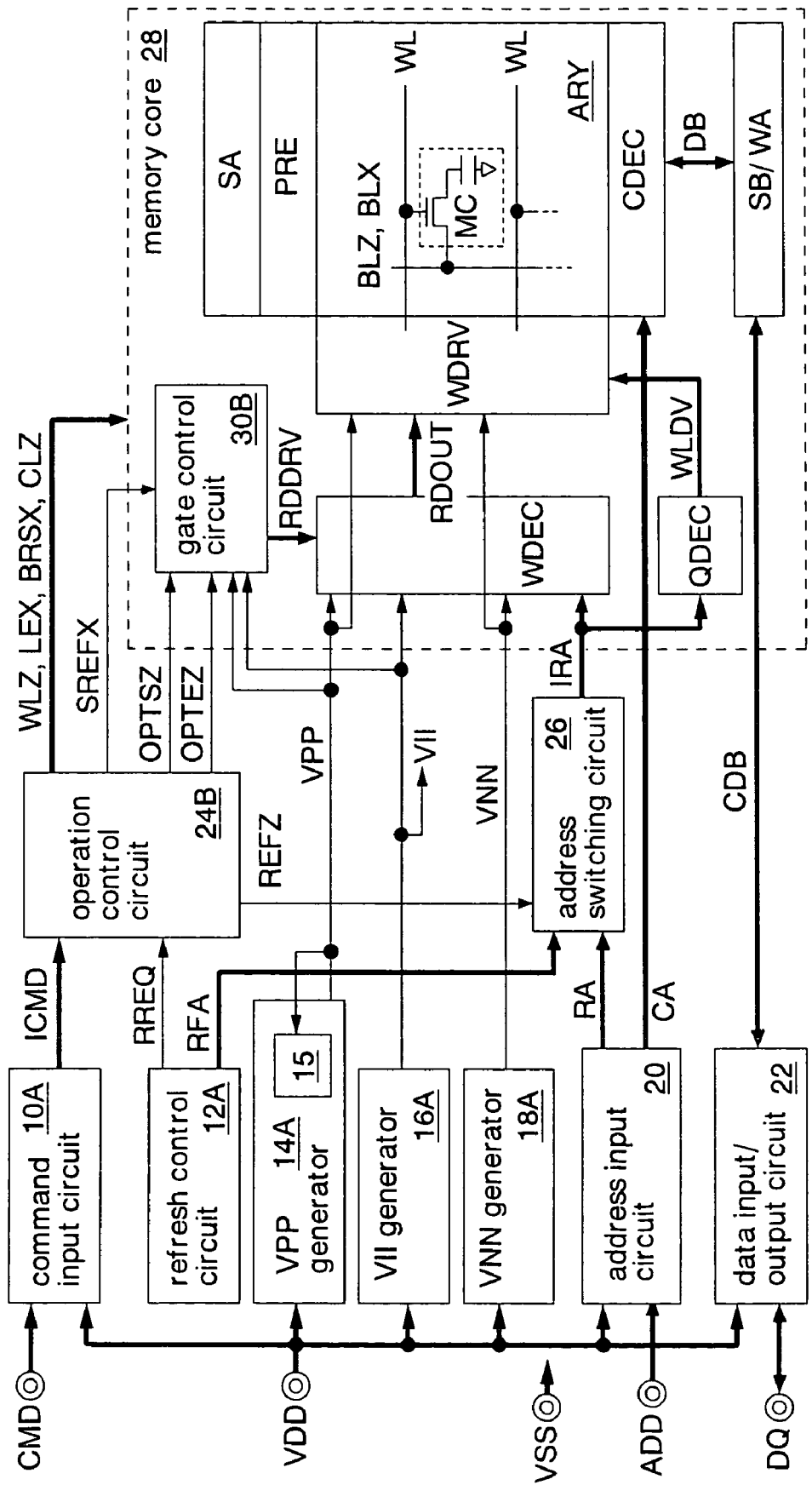
FIG. 8 is a block diagram showing a third embodiment of the semiconductor memory of the present invention.

FIG. 8 shows a third embodiment of the semiconductor memory of the present invention. The same elements as those described in the first and second embodiments will be designated by identical reference numbers or symbols. Detailed description thereof will be omitted. The semiconductor memory of this embodiment is formed on a silicon substrate as a DRAM chip having a self-refresh function by using CMOS processes. The DRAM has an operation control circuit 24B and a gate control circuit 30B instead of the operation control circuit 24A and the gate control circuit 30 of the second embodiment. The rest of the configuration is the same as in the second embodiment. That is, only one operating specification is set for the DRAM, i.e., the DRAM constantly operates in the first specification.

The operation control circuit 24B outputs a self-refresh mode signal SREFX of low level in a self-refresh mode during which only a refresh operation is performed, responding to a refresh request signal RREQ generated by a refresh control circuit 12A and during which access requests are not accepted. The operation control circuit 24B outputs the self-refresh mode signal SREFX of high level in a normal operation mode during which the access requests (a read command, a write command, an auto-refresh command) are accepted. The other functions of the operation control circuit 24B are the same as those of the operation control circuit 24A of the second embodiment described above.

The gate control circuit 30B sets a row driving signal RDDRV (high-level voltage line) at a boost voltage VPP in the first period, i.e., active periods in a self-refresh mode and an entire period of the normal operation mode. The gate control circuit 30B sets the row driving signal RDDRV at an internal power supply voltage VII in standby periods in the self-refresh mode, i.e., the period excluding the first period. The other functions of the gate control circuit 30B are the same as those of the gate control circuit 30 of the first and second embodiments described above.

Figure 9:
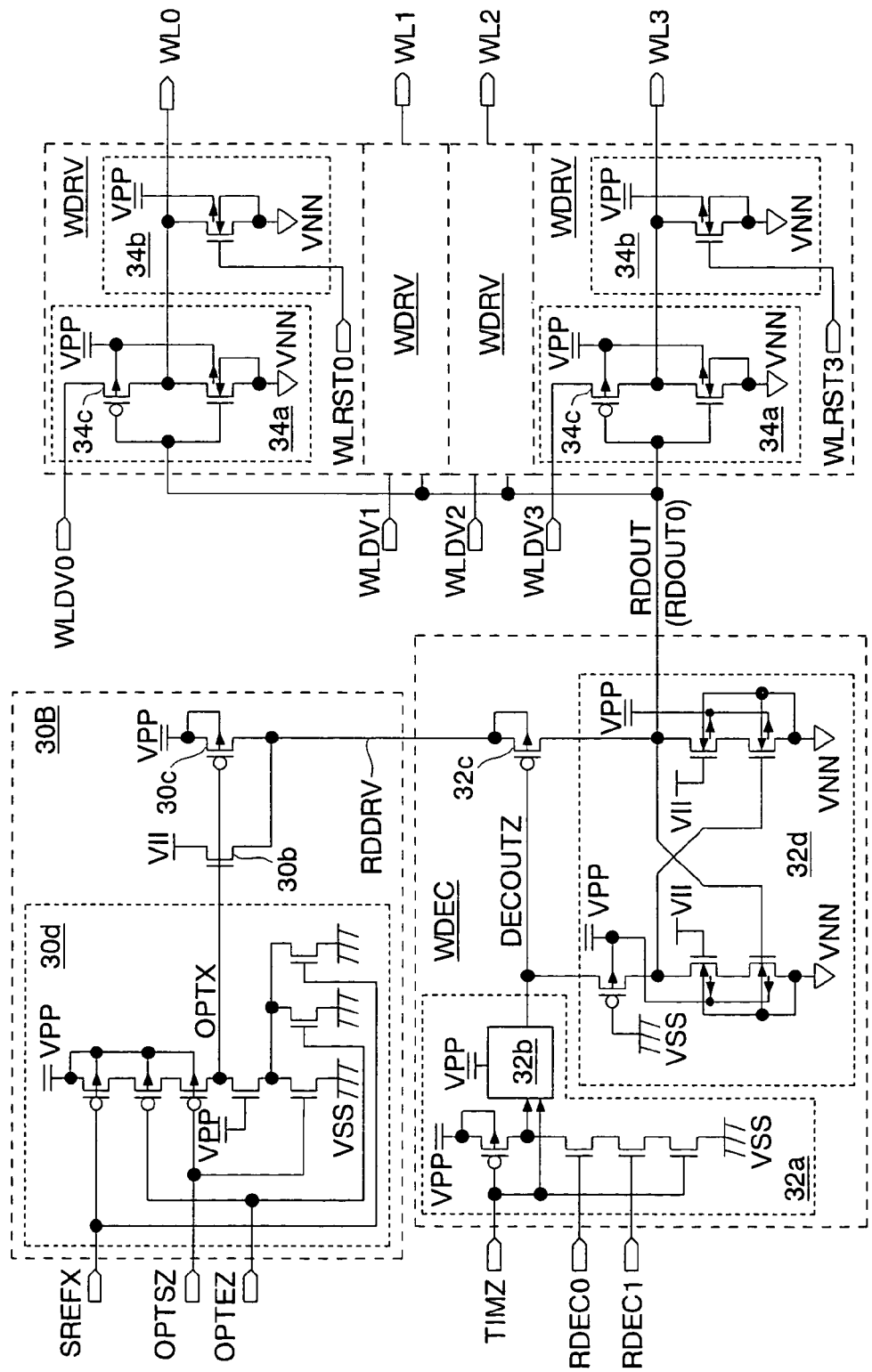
FIG. 9 is a block diagram showing the details of the gate control circuit, the word decoder, and the word driver shown in FIG. 8.

FIG. 9 shows the details of the gate control circuit 30B, the word decoder WDEC, and the word driver WDRV shown in FIG. 8. The word decoder WDEC and the word driver WDRV are the same as those of the first embodiment described above (FIG. 3).

The gate control circuit 30B has a NOR circuit 30d instead of the NOR circuit 30a of the gate control circuit 30 of the first embodiment. The rest of the configuration is the same as in the gate control circuit 30. The NOR circuit 30*d* has three inputs, and it outputs an operation signal OPTX of low level (VSS) when any of an operation start signal OPTSZ, an operation end signal OPTEZ, and a self-refresh mode signal SREFX is at high level, and outputs the operation signal OPTX of high level (VPP) when all of the operation start signal OPTSZ, the operation end signal OPTEZ, and the self-refresh mode signal SREFX are at low level. Therefore, in the normal operation mode during which the self-refresh mode signal SREFX is maintained at high level, the operation signal OPTX is kept at low level. Accordingly, the high-level voltage line RDDRV is fixed to the boost voltage VPP in the normal operation mode.

Figure 10:
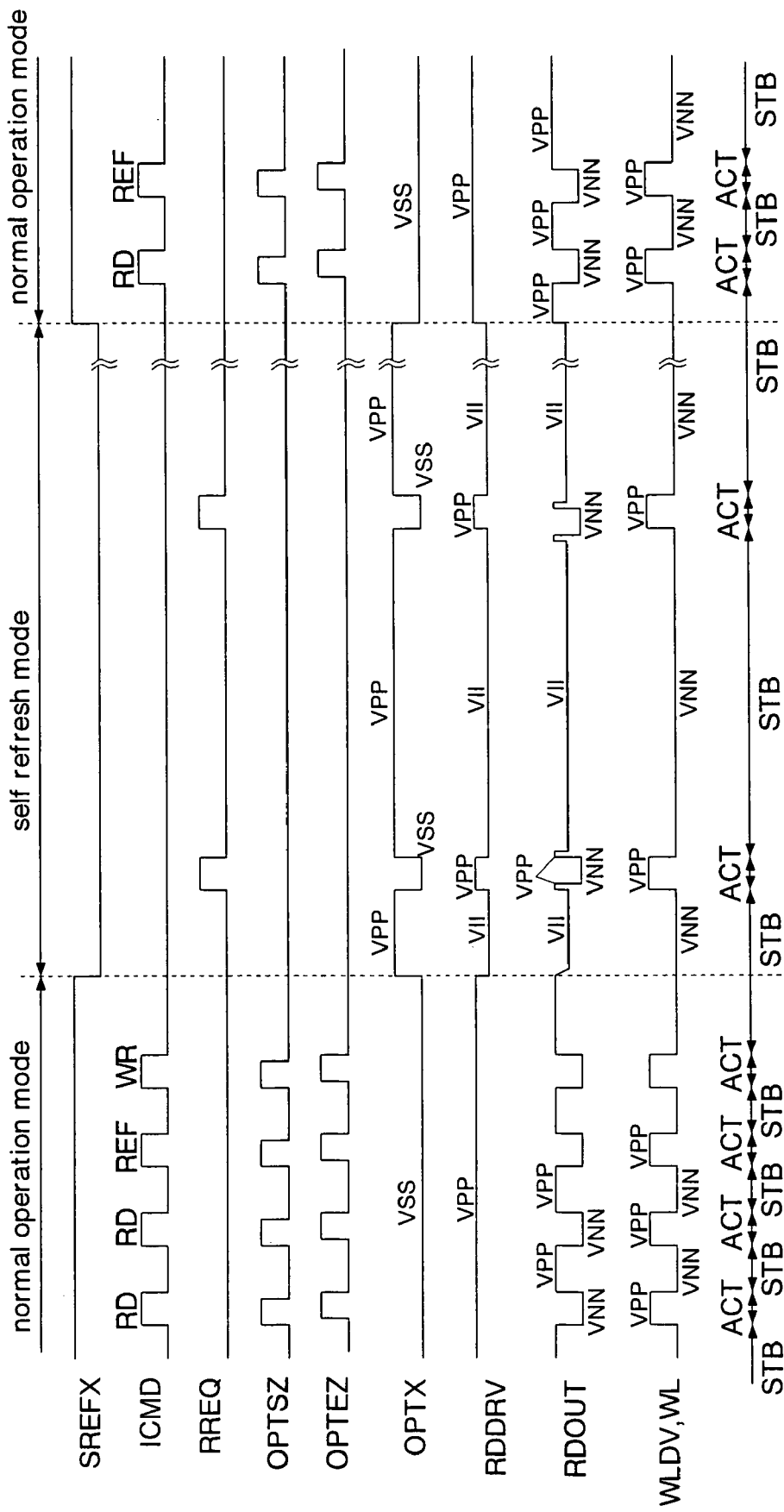
FIG. 10 is a timing chart showing an overview of operations of a DRAM in the third embodiment.

FIG. 10 shows an overview of operations of the DRAM in the third embodiment. Detailed description will be omitted of the same operations as in FIG. 4 and FIG. 5 described above. In this example, when receiving a self-refresh command during the normal operation mode, the DRAM shifts to the self-refresh mode, and when receiving a self-refresh releasing command during the self-refresh mode, it shifts to the normal operation mode.

In the normal operation mode, the self-refresh mode signal SREFX is kept at high level, and the operation signal OPTX is accordingly fixed to low level. Consequently, ON/OFF of the nMOS transistor 30*b* and the pMOS transistor 30*c* (switch circuit) shown in FIG. 9 is not switched over, and the high-level voltage line RDDRV is thus fixed to the boost voltage VPP. This eliminates power consumption for switching operations of the switch circuits 30*b*, 30*c*.

Specifically, the NOR circuit 30*d* does not drive the switch circuits 30*b*, 30*c* and thus consumes little power. In addition, since the high-level voltage line RDDRV does not charge/discharge, it consumes no power for that. This can avoid the boost voltage VPP from unnecessarily used, and lowers the operation frequency of the boost voltage generator 14A. As a result, power consumption of the boost voltage generator 14A also decreases. If a system incorporating a DRAM issues an access request at a high frequency, an increase in power consumption ascribable to GIDL is sometimes larger than that in power consumption ascribable to the switching operations of the switch circuits 30*a*, 30*c*. Such a system can reduce power consumption more when the high-level voltage line RDDRV is kept at the boost voltage VPP than it is changed during the normal operation mode.

Meanwhile, the self-refresh mode signal SREFX is kept at low level in the self-refresh mode. Consequently, the operation signal OPTX is fixed to high level in the standby periods, and is fixed to low level only in the active periods during which the self-refresh operation is performed. That is, in this embodiment, the switch circuits 30*b*, 30*c* perform switching operations only in the refresh operation during the self-refresh mode.

The self-refresh operation is performed every several tens of microseconds, and its operation frequency is low. Therefore, it has little influence on the power consumption that increases in accordance with the operations of the switch circuit 30*b*, 30*c*. The high-level voltage line RDDRV and a row output signal RDOUT are kept at the internal power supply voltage VII in periods excluding the periods in which the self-refresh operation is executed. This can reduce GIDL currents in the self-refresh mode.

Figure 11:
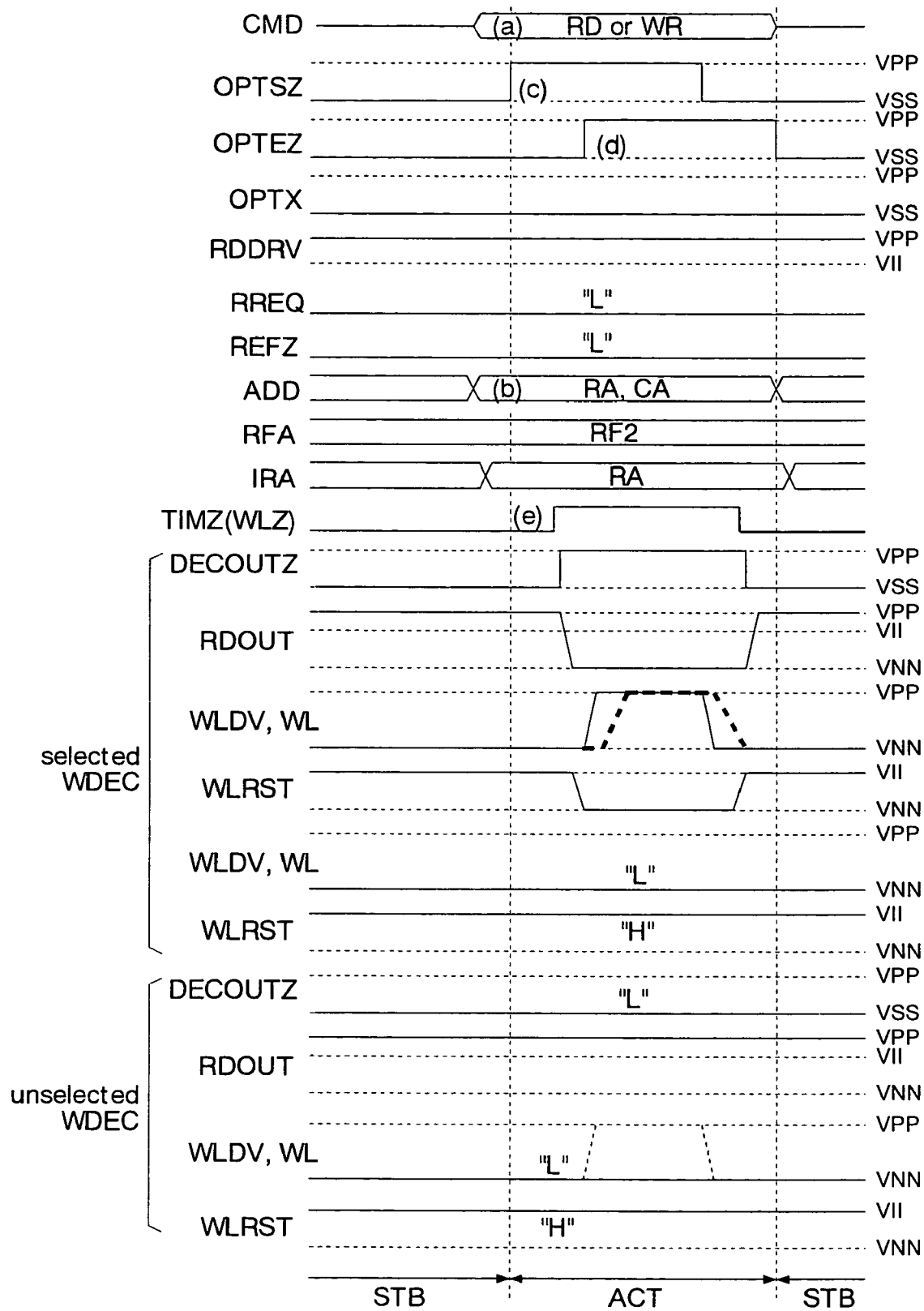
FIG. 11 is a timing chart showing an example where access operations are performed during a normal operation mode in the third embodiment.

FIG. 11 shows an example where access operations are performed during the normal operation mode in the third embodiment. Detailed description will be omitted of the same operations as in FIG. 6 described above. In this example, the high-level voltage line RDDRV is fixed to the boost voltage VPP in the normal operation mode. This means that the high-level voltage of the row output signal RDOUT is only the boost voltage VPP. The other operations are the same as those in FIG. 6.

This embodiment can also provide the same effects as those of the first and second embodiments described above. In addition, in this embodiment, the high-level voltage line RDDRV is fixed to the boost voltage VPP in the normal operation mode, and thus the switch circuits 30*b*, 30*c* do not perform the switching operations during the normal operation mode. Consequently, the charging/discharging frequency of the high-level voltage line RDDRV lowers, enabling a reduction in power consumption. The present invention can achieve a high effect, in particular, when applied to a DRAM mounted on a system in which memory cells are accessed at a high frequency during the normal operation mode. Further, GIDL currents can be reduced in the self-refresh mode with a reduction in standby current.

The reduction in unnecessary consumption of the boost voltage VPP can reduce unnecessary operations of the boost voltage generator 14A. Since a typical boost voltage generation efficiency of the boost voltage generator 14A is several tens %, the reduction in unnecessary consumption of the boost voltage VPP produces a great effect of reducing power consumption.

Figure 12:
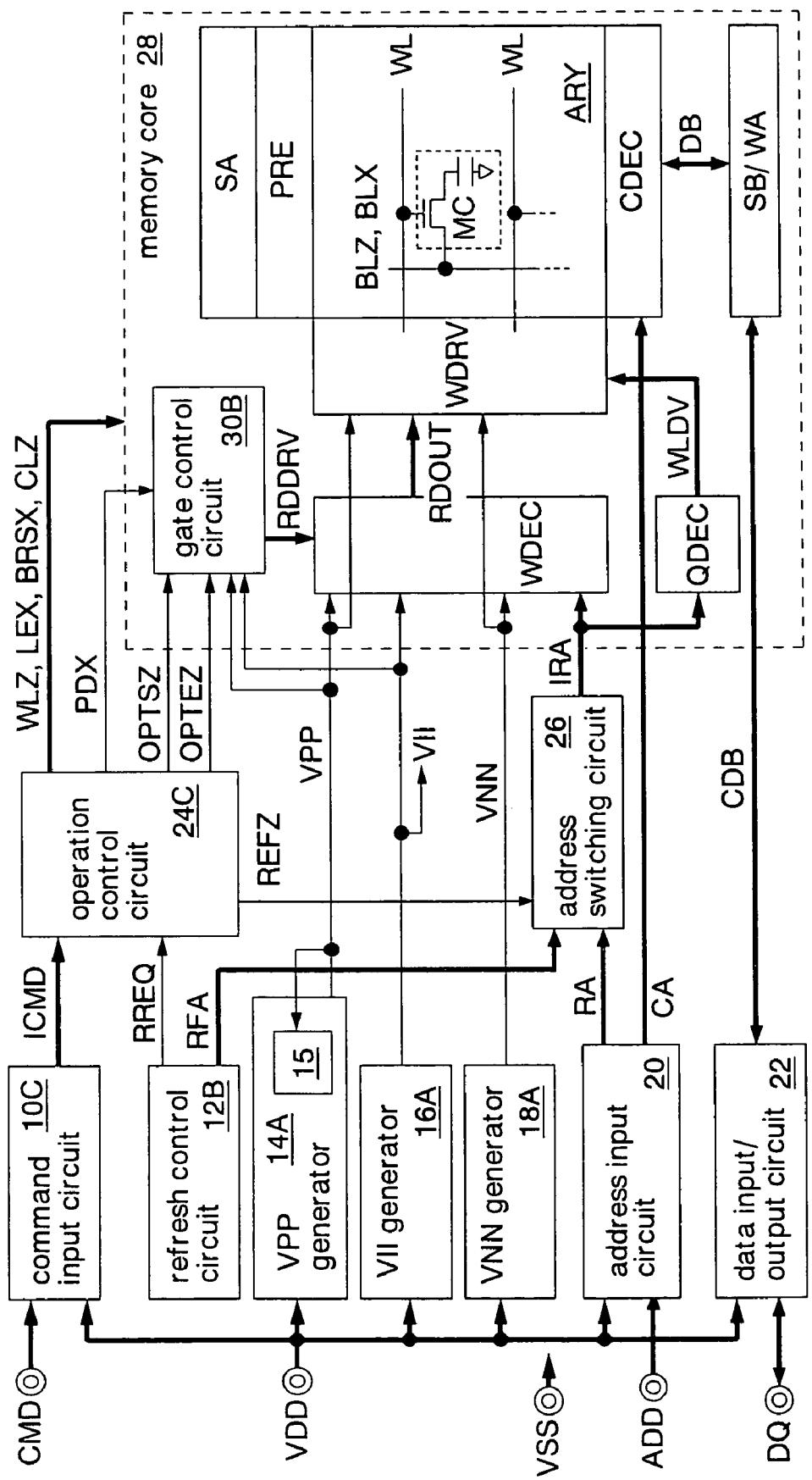
FIG. 12 is a block diagram showing a fourth embodiment of the semiconductor memory of the present invention.

FIG. 12 shows a fourth embodiment of the semiconductor memory of the present invention. The same elements as those described in the first and second embodiments will be designated by identical reference numbers or symbols. Detailed description thereof will be omitted. The semiconductor memory of this embodiment is formed on a silicon substrate as a DRAM chip having a self-refresh function by using CMOS processes. The DRAM has a command input circuit 10C, an operation control circuit 24C, and a gate control circuit 30B instead of the command input circuit 10A, the operation control circuit 24A, and the gate control circuit 30 of the second embodiment. The rest of the configuration is the same as in the second embodiment. That is, only one operating specification is set for the DRAM, i.e., the DRAM constantly operates in the first specification.

The command input circuit 10*c* has a function of activating a power-down command signal (one of internal command signals ICMD) when receiving a power-down command through a command terminal CMD, and deactivating the power-down command signal when receiving a power-down releasing command. The other functions of the command input circuit 10C are the same as those of the command input circuit 10A shown in FIG. 7.

A system having the DRAM issues the power-down command in order to reduce a standby current when it keeps a standby period of the DRAM long. In response to the power-down command, the DRAM has the chip to shift from a normal operation mode to a power-down mode, in which no access request is accepted and no refresh operation is performed. Further, in response to the power-down releasing command, the DRAM allows the chip to shift from the power-down mode to the normal operation mode. In the power-down mode, for example, an input buffer for an address signal ADD and a data signal DQ is prohibited from performing input operations. Reducing leakage currents from the input buffer can reduce the standby current.

The operation control circuit 24C has a function of activating a power-down mode signal PDX at low level while the power-down command signal is activated. The power-down mode signal PDX is supplied to the gate control circuit 30B. The other functions of the operation control circuit 24C are the same as those of the operation control circuit 24A shown in FIG. 7.

Figure 13:
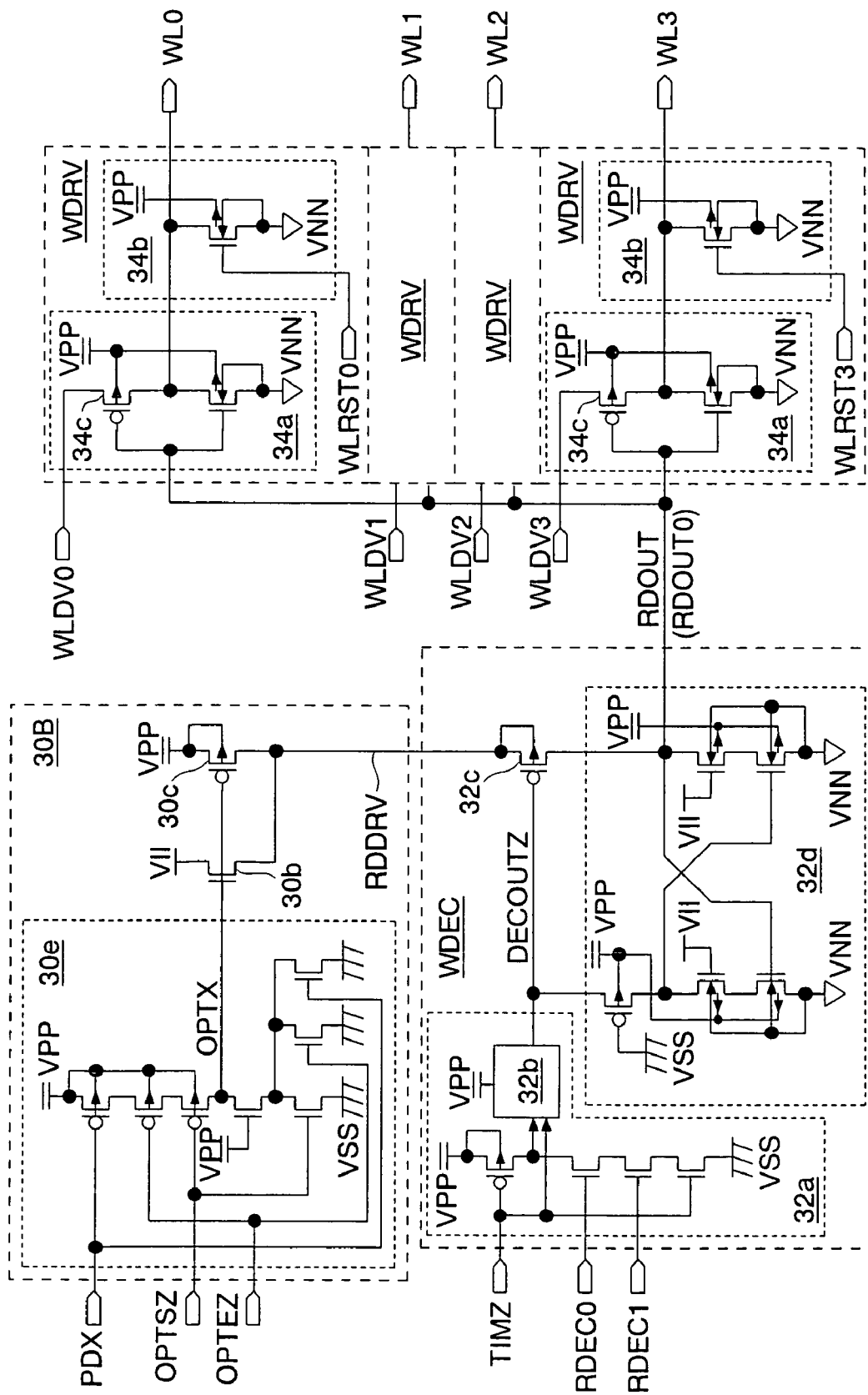
FIG. 13 is a block diagram showing the details of the gate control circuit, the word decoder, and the word driver which are shown in FIG. 12.

FIG. 13 shows the details of the gate control circuit 30B, the word decoder WDEC, and the word driver WDRV which are shown in FIG. 12. The configuration of these circuits is the same as in the third embodiment described above (FIG. 9). However, in this embodiment, the gate control circuit 30B receives the power-down mode signal PDX instead of the self-refresh mode signal SREFX.

Therefore, the gate control circuit 30B outputs an operation signal OPTX of low level (VSS) when any of an operation start signal OPTSZ, an operation end signal OPTEZ, and the power-down mode signal PDX is at high level, and outputs the operation signal OPTX of high level (VPP) when all of the operation start signal OPTSZ, the operation end signal OPTEZ, and the power-down mode signal PDX are at low level. Therefore, in the normal operation mode (first period) during which the power-down mode signal PDX is kept at high level, the operation signal OPTX is kept at low level and a high-level voltage line RDDRV is fixed to a boost voltage VPP. In the power-down mode (the period excluding the first period) during which the power-down mode signal PDX is kept at low level, the operation signal OPTX is kept at high level and the high-level voltage line RDDRV is fixed to an internal power supply voltage VII since the operation start signal OPTSZ and the operation end signal OPTEZ are not activated.

Figure 14:
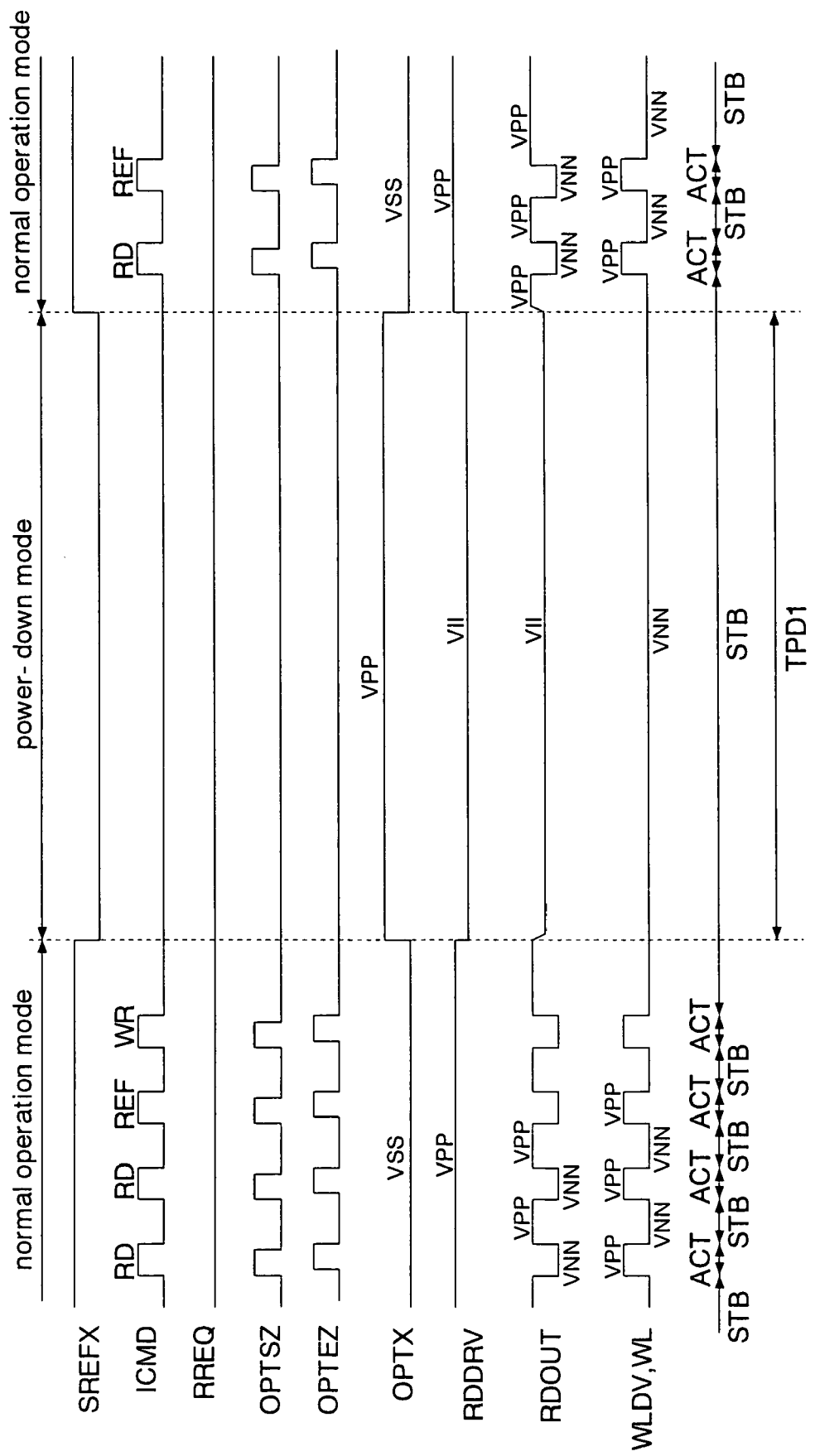
FIG. 14 is a timing chart showing an overview of operations of a DRAM in the fourth embodiment.

FIG. 14 shows an overview of operations of the DRAM in the fourth embodiment. Detailed description will be omitted of the same operations as in FIG. 10 described above. In this example, the DRAM shifts to the power-down mode when receiving the power-down command during the normal operation mode, and shifts to the normal operation mode when receiving the power-down releasing command during the power-down mode. The maximum period TPD1 of the power-down mode is the maximum period during which a refresh operation need not be inserted, and is typically several tens of microseconds.

The operations in the normal operation mode are the same as those in FIG. 10 described above. Neither the access operations nor refresh operation is performed during the power-down mode. That is, the standby period continues. Consequently, the high-level voltage line RDDRV and the row output signal RDOUT are fixed to the internal power supply voltage VII in the power-down mode. This can reduce GIDL currents in the power-down mode.

This embodiment can also provide the same effects as those of the first to third embodiments described above. In addition, in this embodiment, the high-level voltage line RDDRV is fixed to the internal voltage line VII in the power-down mode, enabling a reduction in power consumption (standby current) in the power-down mode. The switch circuits 30b, 30c do not perform switching operations during the normal operation mode. Therefore, the present invention can achieve a high effect, in particular, when applied to a DRAM mounted on a system in which memory cells are accessed at a high frequency during the normal operation mode and which needs the power-down mode.

Figure 15:
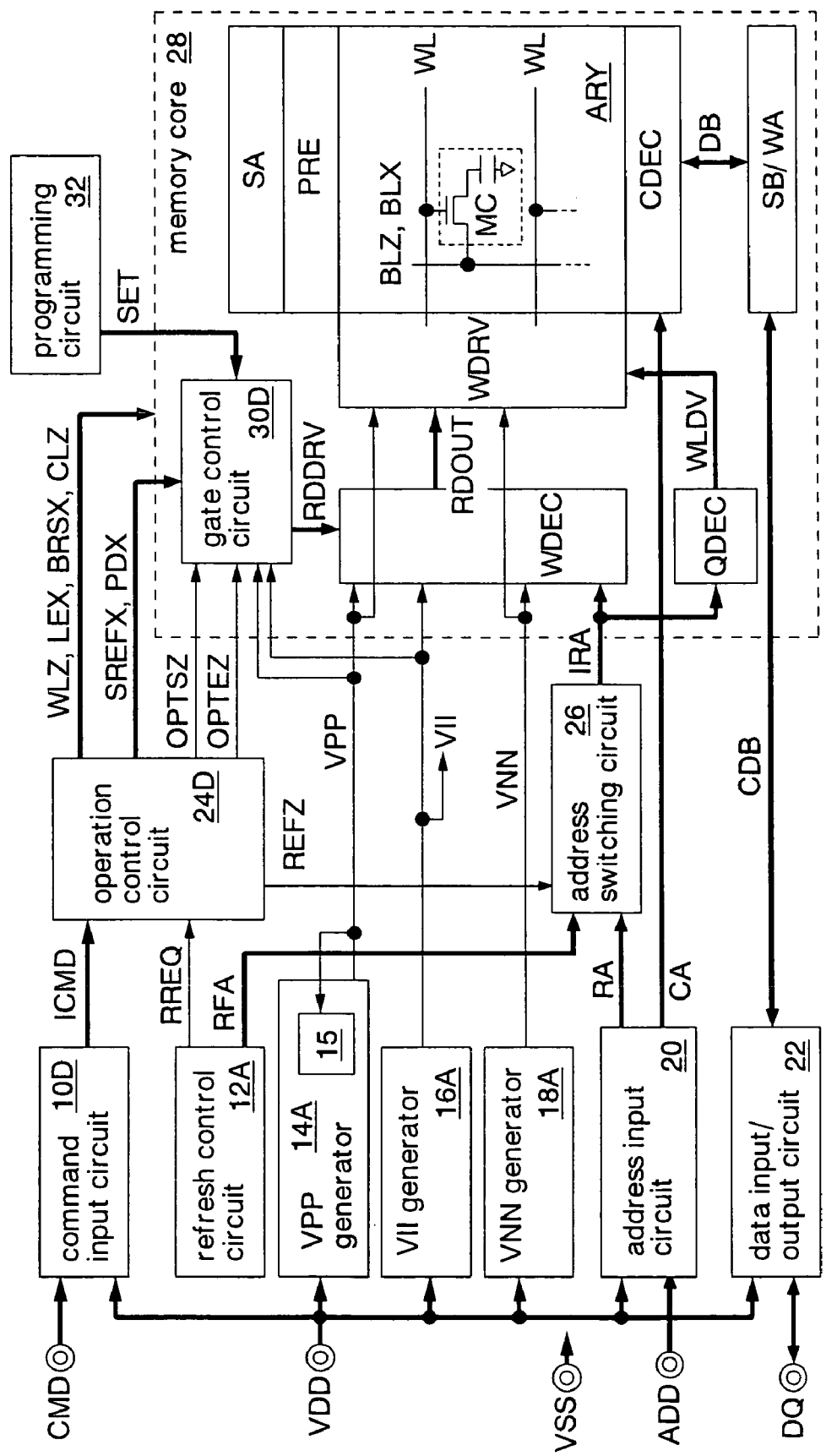
FIG. 15 is a block diagram showing a fifth embodiment of the semiconductor memory of the present invention.

FIG. 15 shows a fifth embodiment of the semiconductor memory of the present invention. The same elements as those described in the first to fourth embodiments will be designated by identical reference numbers or symbols. Detailed description thereof will be omitted. The semiconductor memory of this embodiment is formed on a silicon substrate as a DRAM chip having a self-refresh function by using CMOS processes. The DRAM has a command input circuit 10D, an operation control circuit 24D, and a gate control circuit 30D instead of the command input circuit 10A, the operation control circuit 24A, and the gate control circuit 30 of the second embodiment. Further, a programming circuit 32 is additionally formed. The rest of the configuration is the same as in the second embodiment.

The command input circuit 10D has a function of receiving a self-refresh command, a self-refresh releasing command, a power-down command, and a power-down releasing command. The other functions of the command input circuit 10D are the same as those of the command input circuit 10A shown in FIG. 7.

The operation control circuit 24D has a function of activating or deactivating a self-refresh mode signal SREFX and a power-down mode signal PDX in response to the self-refresh command or the self-refresh releasing command, and the power-down command or the power-down releasing command, respectively. The other functions of the operation control circuit 24D are the same as those of the operation control circuit 24A shown in FIG. 7.

The programming circuit 32 outputs setting signals SET each consisting of a plurality of bits in accordance with a programmed value preset in manufacturing processes of the DRAM. The DRAM is manufactured and shipped as one of a plurality of kinds of products having different functions which are associated with the set values of the programming circuit 32. The details of the programming circuit 32 will be described in FIG. 16.

In accordance with the setting signals SET from the programming circuit 32, the gate control circuit 30D sets a high-level voltage line RDDRV at a boost voltage VPP or an internal power supply voltage VII in a standby period during which the DRAM is operative in a first specification to be described later.

Figure 16:
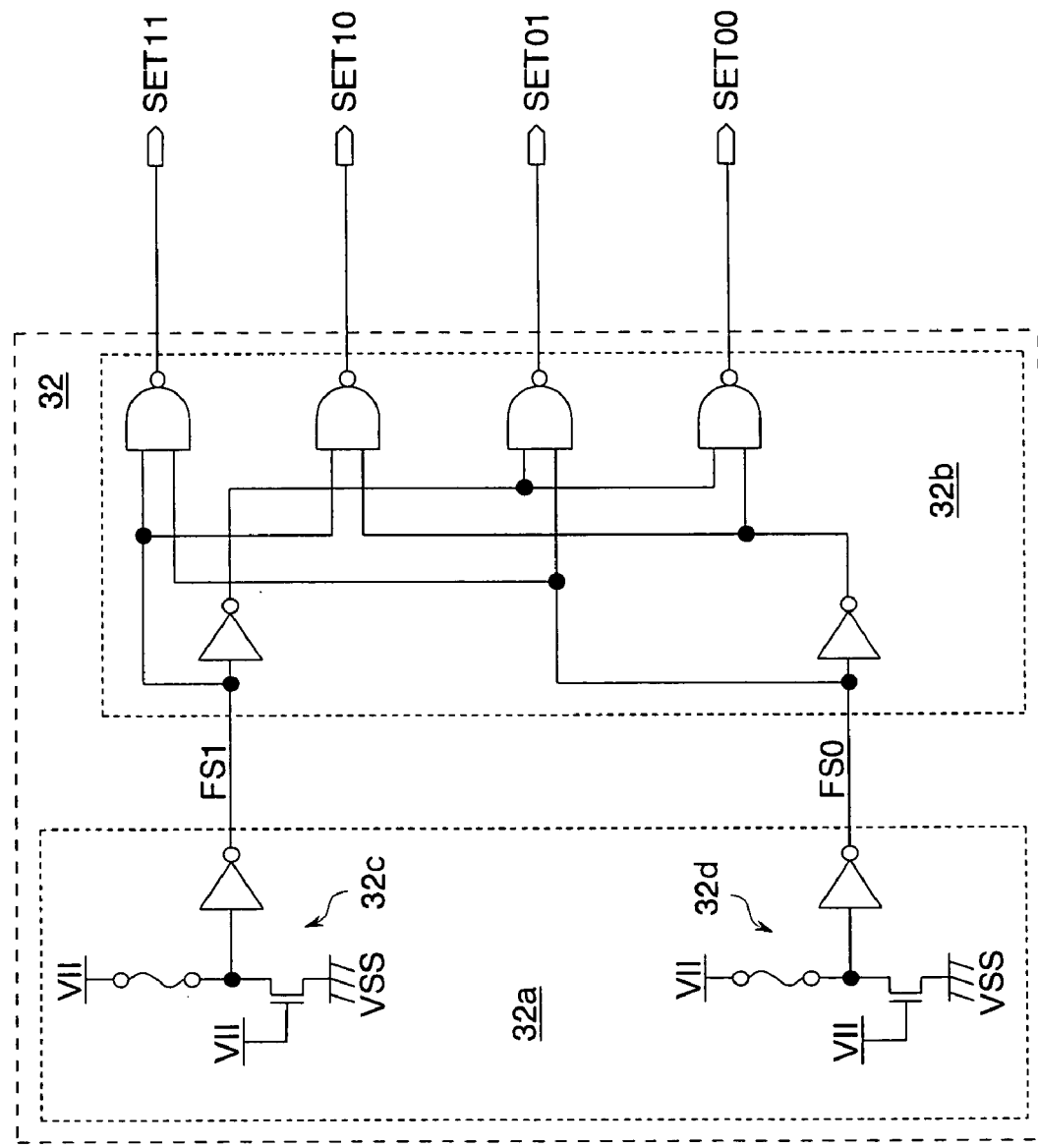
FIG. 16 is a circuit diagram showing the details of the programming circuit shown in FIG. 15.

FIG. 16 shows the details of the programming circuit 32 shown in FIG. 15. The programming circuit 32 has a ROM circuit 32a for outputting fuse signals FS1, FS0 whose logic is fixed in a manufacturing process of the DRAM, and a decoder 32b for decoding the fuse signals FS1, FS0 and outputting the setting signals SET (SET11, SET10, SET01, SET00). The ROM circuit 32a has two ROM units 32c, 32d. Each of the ROM units 32c, 32d has a fuse and an nMOS transistor which are connected in series between an internal power supply line VII and a ground line VSS, and an inverter connected to a connection node of the fuse and the nMOS transistor. The nMOS transistor is connected to the internal power supply line VII at its gate to be constantly ON and it works as a high-resistance resistor.

The ROM unit (32c or 32d) including the fuse outputs the fuse signal (FS1 or FS0) of low level. The ROM unit (32c or 32d), when the fuse is blown out, outputs the fuse signal (FS1 or FS0) of high level. Each of two fuses is or is not blown out according to the manufacturing specification in the manufacturing process of the DRAM, whereby the decoder 32b sets only one of the setting signals SET at low level. A high-level voltage and a low-level voltage of the setting signals SET are set at a boost voltage VPP and a ground voltage VSS respectively. The high-level voltage of the setting signals SET is converted into the boost voltage VPP by a not-shown level conversion circuit. Incidentally, the final numerals in the setting signals SET11, SET10, SET01, SET00 represent the logic of the fuse signals FS1, FS0. For example, when the logic of the fuse signals FS1, FS0 is "10" in a binary form, the setting signal SET10 maintains at low level and the other setting signals SET11, SET01, SET00 maintain at high level.

Figure 17:
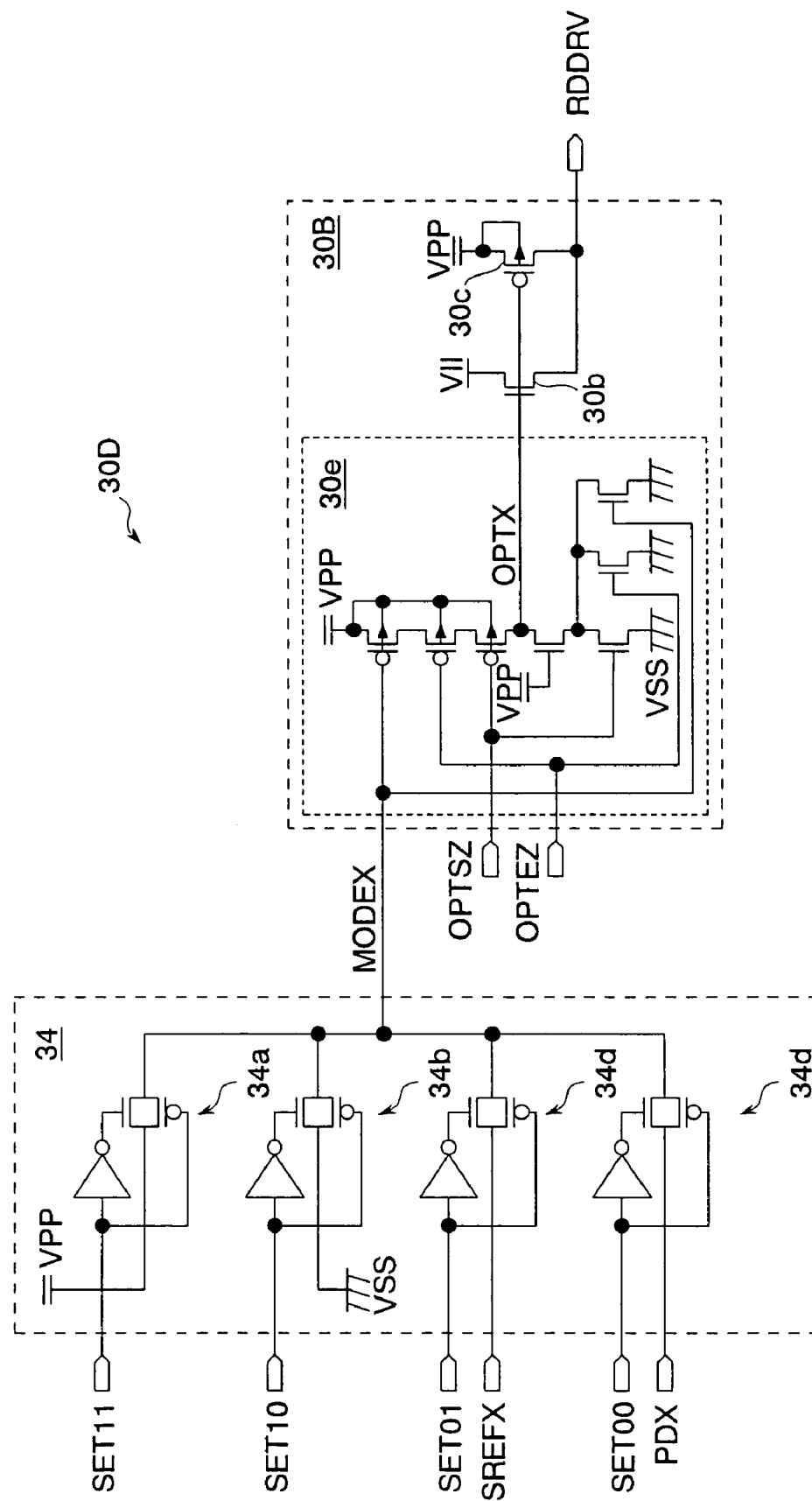
FIG. 17 is a circuit diagram showing the details of the gate control circuit shown in FIG. 15.

FIG. 17 shows the details of the gate control circuit 30D shown in FIG. 15. The gate control circuit 30D is formed of the gate control circuit 30B of the third embodiment and a mode selector 34. An output mode MODEX of the mode selector 34 is inputted to a NOR circuit 30e of the gate control circuit 30B along with an operation start signal OPTSZ and an operation end signal OPTEZ.

The mode selector 34 has switches 34a, 34b, 34c, 34d that are ON while receiving the setting signals SET11, SET10, SET01, SET00 of low level respectively. Each of the switches 34a, 34b, 34c, 34d is constituted of a CMOS transmission gate. The mode selector 34 connects the output node MODEX to the boost voltage line VPP or the ground line VSS in accordance with information set in the programming circuit 32, or supplies the output node MODEX with the self-refresh mode signal SREFX or the power-down mode signal PDX.

FIG. 18 shows operations of the gate control circuit 30D shown in FIG. 17. When the programming circuit 32 activates the setting signal SET11 at low level, the output node MODEX is set at the boost voltage VPP. At this time, the high-level voltage line RDDRV is constantly set at the boost voltage VPP irrespective of the operation mode (a normal operation mode, a self-refresh mode, a power-down mode). When the setting signal SET10 is activated at low level, the output node MODEX is set at the ground voltage VSS. At this time, the high-level voltage line RDDRV is set at the boost voltage VPP in active periods ACT and is set at the internal power supply voltage VII in standby periods STB.

When the setting signal SET01 is activated to low level, the output node MODEX is connected to a signal line of the self-refresh mode signal SREFX. At this time, the high-level voltage line RDDRV is set at the internal power supply voltage VII only in the standby period STB of the self-refresh mode and is set at the boost voltage VPP in the other periods as in the third embodiment described above. When the setting signal SET00 is activated to low level, the output node MODEX is connected to a signal line of the power-down mode signal PDX. At this time, the high-level voltage line RDDRV is set at the internal power supply voltage VII in the power-down mode and is set at the boost voltage VPP in the other periods, as in the fourth embodiment described above.

For example, it is made possible to manufacture a DRAM in which voltage of the high-level voltage line RDDRV is not switched, by pre-programming the programming circuit 32 to activate the setting signal SET11 at low level. This DRAM is shipped for a system which issues access requests at a high frequency. It is made possible to manufacture a DRAM in which the high-level voltage line RDDRV is switched to the boost voltage VPP in the active periods ACT and to the internal power supply voltage VII in the standby periods STB by pre-programming the programming circuit 32 to activate the setting signal SET10 at low level. This DRAM is shipped for a system which issues access requests at a low frequency and requires reduced power consumption in the self-refresh mode.

If the programming circuit 32 is pre-programmed to activate the setting signal SET01 at low level, it is possible to manufacture a DRAM in which the high-level voltage line RDDRV is switched to the internal power supply voltage VII only in the standby periods STB of the self-refresh mode, as in the third embodiment (FIG. 10). This DRAM is shipped for a system which issues access requests at a high frequency and requires reduced power consumption in the self-refresh mode. If the programming circuit 32 is pre-programmed to activate the setting signal SET00 at low level, it is possible to manufacture a DRAM in which the high-level voltage line RDDRV is switched to the internal power supply voltage VII only in the power-down mode, as in the fourth embodiment (FIG. 14). This embodiment thus makes it thus possible to manufacture four kinds of DRAMs with different operating specifications (product specifications) from a single DRAM chip in accordance with the set value of the programming circuit 32.

In this example, when the setting signal SET11 is activated at low level, the operating specification of the DRAM is a second specification in which the high-level voltage line RDDRV is continuously connected to the boost voltage line VPP. When any one of the setting signals SET10, SET01, SET00 is activated at low level, the operating specification of the DRAM is the first specification in which the voltage of the high-level voltage line RDDRV is switched to the boost voltage VPP or the internal voltage VII.

Figure 19:
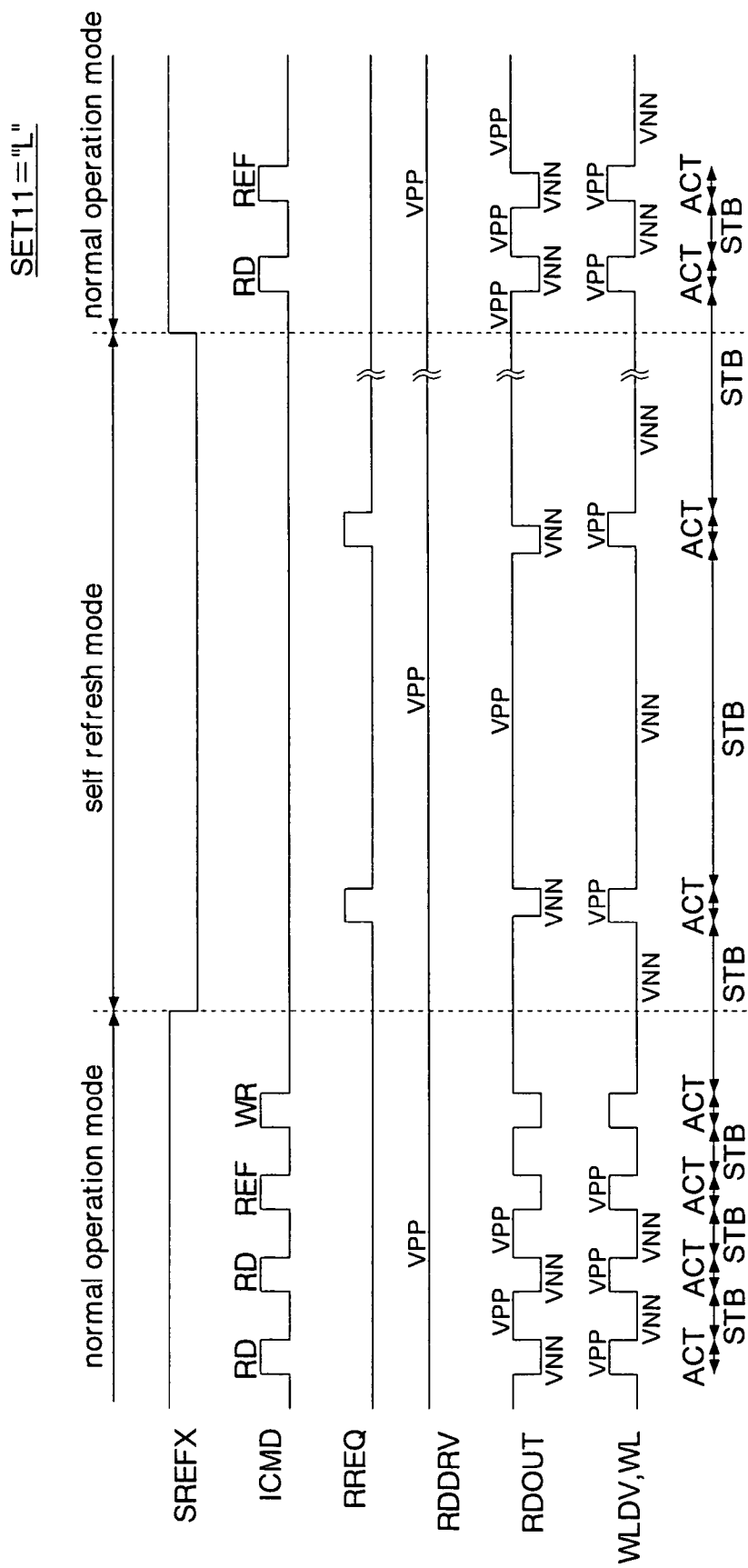
FIG. 19 is a timing chart showing an example of operations of a DRAM in the fifth embodiment.

FIG. 19 shows an example of operations of the DRAM in the fifth embodiment. This example represents the operations of the DRAM in which the setting signal SET11 is activated to low level by the programming circuit 32 and the high-level voltage line RDDRV is constantly kept at the boost voltage VPP.

Figure 20:
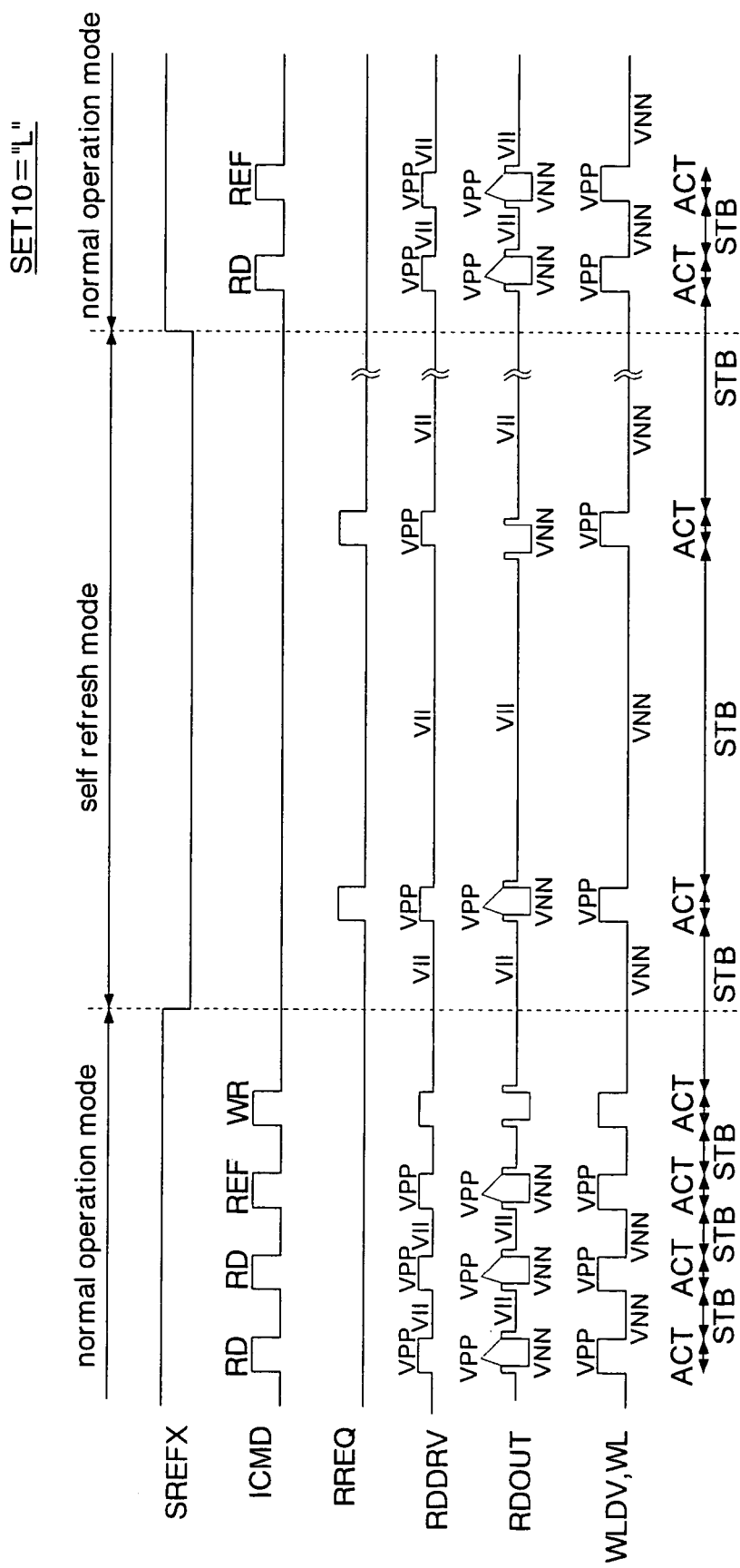
FIG. 20 is a timing chart showing another example of operations of the DRAM in the fifth embodiment.

FIG. 20 shows another example of operations of the DRAM in the fifth embodiment. This example represents the operations of the DRAM in which the setting signal SET10 is activated at low level by the programming circuit 32 and the high-level voltage line RDDRV is set at the boost voltage VPP only in the active periods ACT and is set at the internal power supply voltage VII in the standby periods STB.

This embodiment can also provide the same effects as those of the first to fourth embodiments described above. In addition, in this embodiment, the programming circuit 32 can change the product specification of the DRAM. Therefore, by programming the programming circuit 32 in accordance with the operating specification of a system on which the DRAM is to be mounted, the DRAM optimum for each system can be provided. For example, in a system having a semiconductor memory in which memory cells are accessed at a high frequency and a standby current is of a little importance, the operating specification of the semiconductor memory is set to the second specification. In a system in which memory cells are accessed at a low frequency and thus the standby current is of great importance, the operating specification of the semiconductor memory is set to the first specification. It is possible to design and manufacture a plurality of kinds of products at design cost for a single product, which can reduce development cost and development period of the DRAM.

Figure 21:
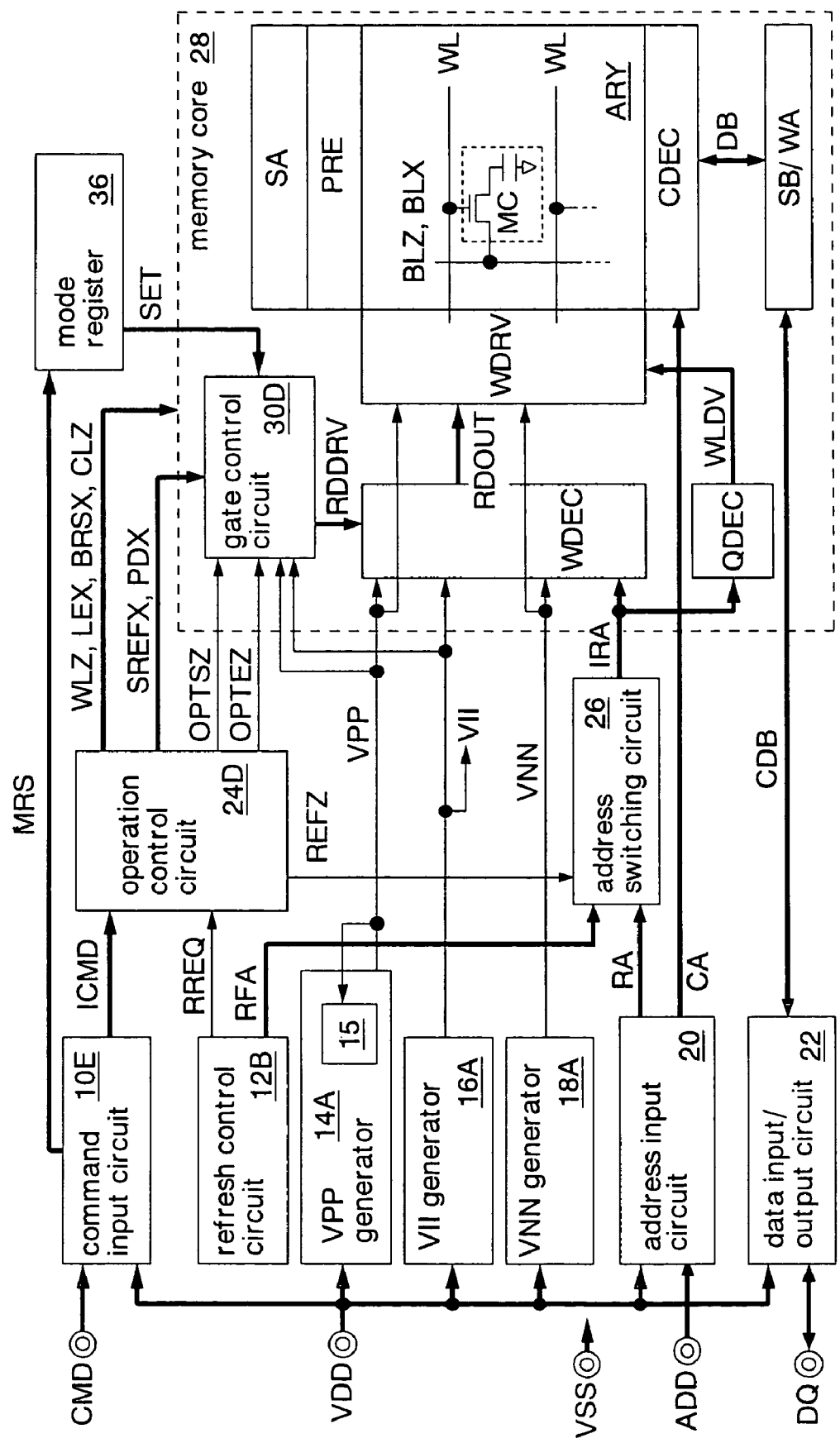
FIG. 21 is a block diagram showing a sixth embodiment of the semiconductor memory of the present invention.

FIG. 21 shows a sixth embodiment of the semiconductor memory of the present invention. The same elements as those described in the first to fifth embodiments will be designated by identical reference numbers or symbols. Detailed description thereof will be omitted. The semiconductor memory of this embodiment is formed on a silicon substrate as a DRAM chip having a self-refresh function by using CMOS processes. The DRAM has a command input circuit 10E and a mode register 36 instead of the command input circuit 10D and the programming circuit 32 of the fifth embodiment. The rest of the configuration is the same as in the fifth embodiment.

The command input circuit 10E has a function of receiving a mode register setting command. The other functions of the command input circuit 10E are the same as those of the command input circuit 10D shown in FIG. 15.

Set values of internal registers of the mode register 36 are rewritten in accordance with a mode register setting signal MRS supplied thereto through the command input circuit 10E. The set contents of the mode register 36 are outputted to the gate control circuit 30D as setting signals SET. The relation between the logic of the setting signals SET and the operation modes of the DRAM is the same as that in FIG. 18 described above. That is, in this DRAM, the set values of the mode register 36 are rewritten after the DRAM is manufactured, whereby the DRAM can be set to any one of the plural kinds of product specifications with different functions (the four operating specifications shown in FIG. 18).

This embodiment can also provide the same effects as those of the first to fifth embodiments described above. In addition, in this embodiment, for example, making the mode register available to a user will allow the user to optimally change the operating specifications of the DRAM in accordance with his/her intended use of a system.

Figure 22:
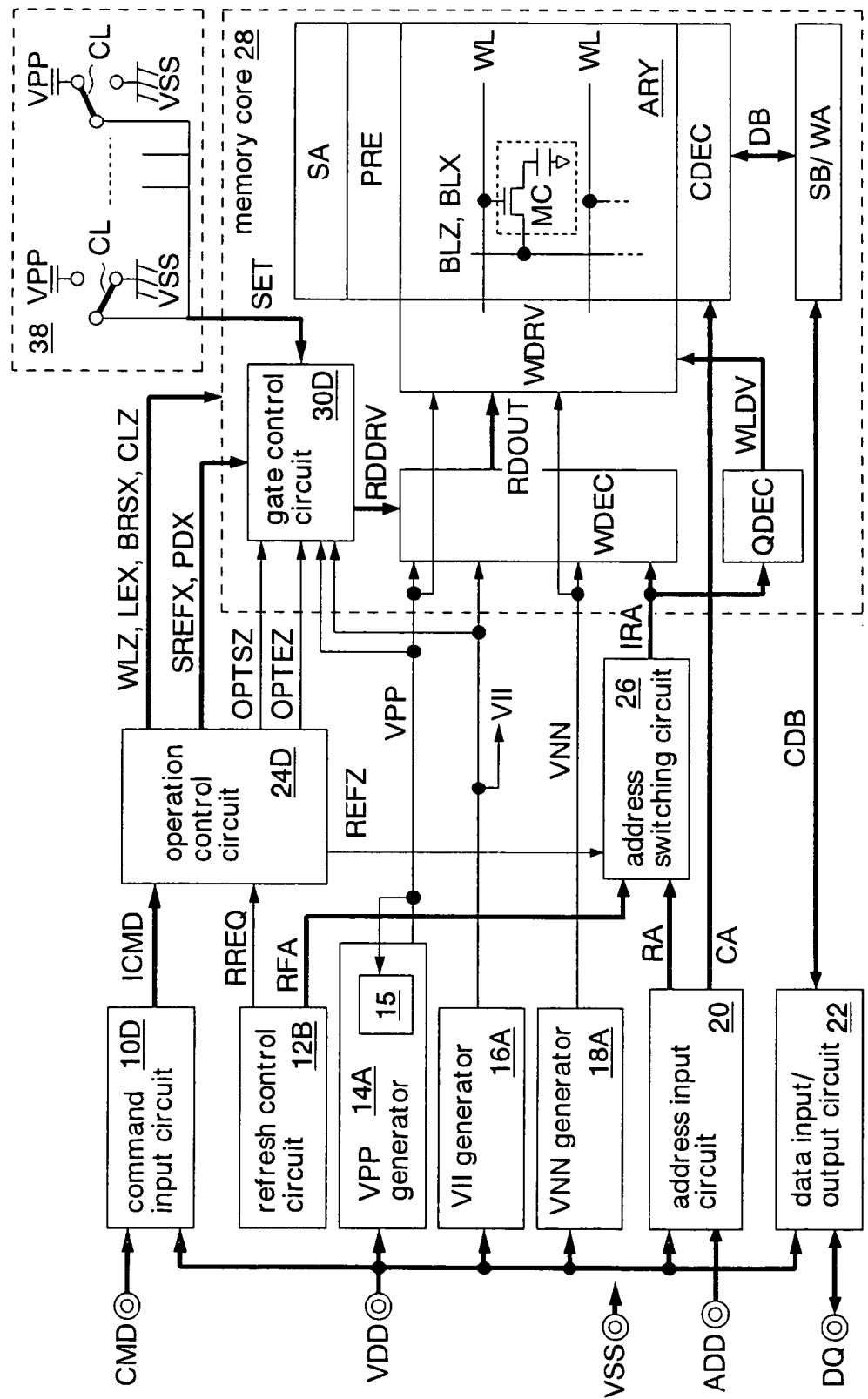
FIG. 22 is a block diagram showing a seventh embodiment of the semiconductor memory of the present invention.

FIG. 22 shows a seventh embodiment of the semiconductor memory of the present invention. The same elements as those described in the first to fifth embodiments will be designated by identical reference numbers or symbols. Detailed description thereof will be omitted. The semiconductor memory of this embodiment is formed on a silicon substrate as a DRAM chip having a self-refresh function by using CMOS processes. The DRAM has a wiring/connecting unit 38 instead of the programming circuit 32 of the fifth embodiment. The rest of the configuration is the same as in the fifth embodiment.

The wiring/connecting unit 38 has, for example, four conductive films CL using metal wiring layers (the diagram shows only two of the four conductive films CL). The conductive films CL are formed at predetermined positions over a semiconductor substrate so as to match the pattern shapes of photomasks used in semiconductor manufacturing processes. One end of each of the conductive films CL is connected to a signal line of each setting signal (SET11, SET10, SET01, SET00), and the other end of the conductive film CL is connected to a boost voltage line VPP or a ground line VSS according to the pattern shapes of the photomasks.

Any one of the setting signals SET11, SET10, SET01, SET00 is set at a ground voltage VSS in a manufacturing process (wiring process) of the DRAM, and the other setting signals are set at a boost voltage VPP. That is, the DRAM is manufactured as any one of a plurality of kinds of products (four operating specifications shown in FIG. 18) having different functions, in accordance with the shapes (connection destinations) of the conductive films CL formed in the manufacture processes of the DRAM.

This embodiment can also provide the same effects as those of the first to fifth embodiments described above. In addition, in this embodiment, the product specification of the DRAM can be changed by changing the photomasks used in the manufacturing processes of the DRAM.

Figure 23:
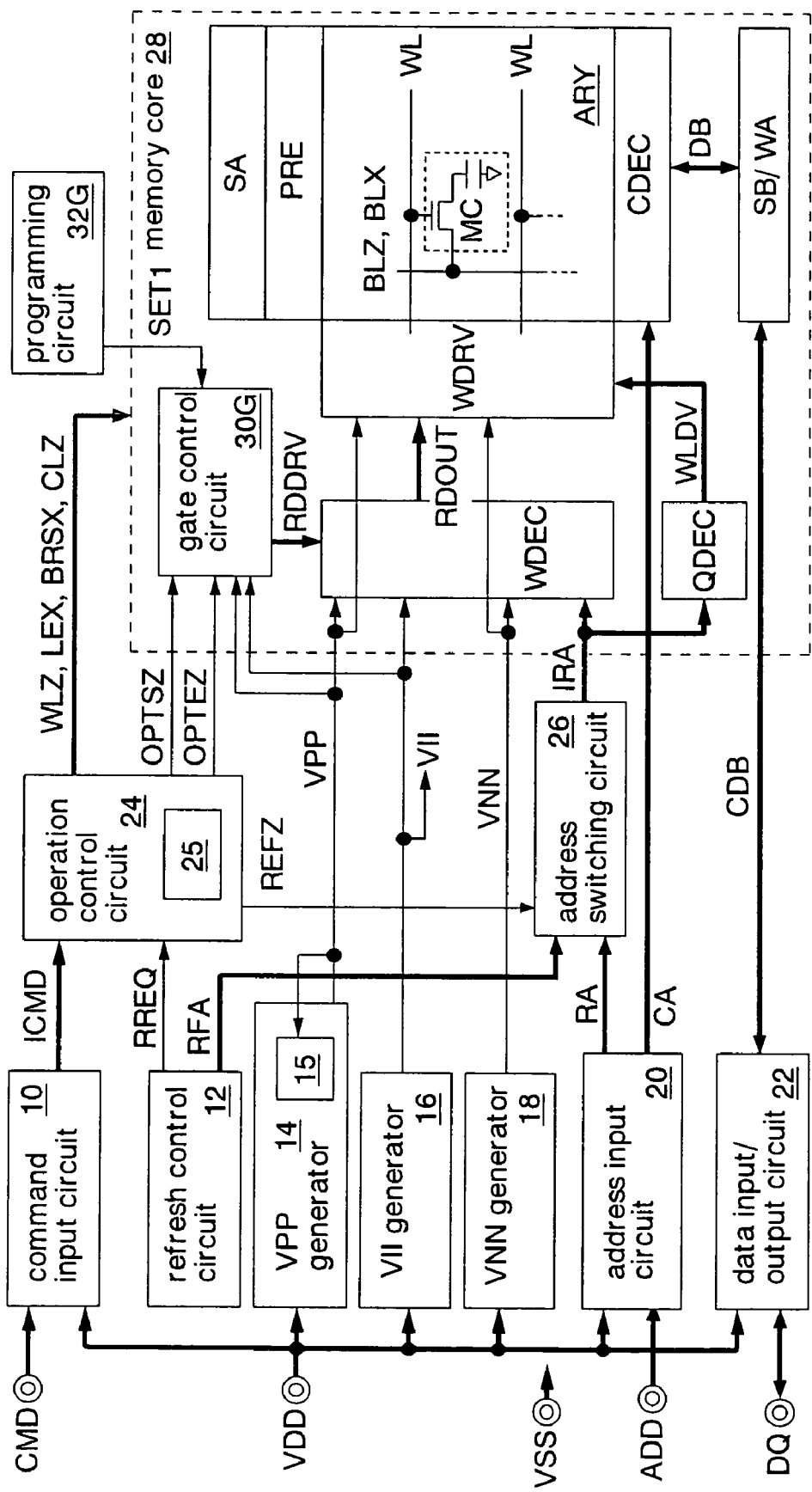
FIG. 23 is a block diagram showing an eighth embodiment of the semiconductor memory of the present invention.

FIG. 23 shows an eighth embodiment of the semiconductor memory of the present invention. The same elements as those described in the first to fifth embodiments will be designated by identical reference numbers or symbols. Detailed description thereof will be omitted. The semiconductor memory of this embodiment is formed as a pseudo SRAM chip on a silicon substrate by using CMOS processes. The pseudo SRAM has a gate control circuit 30G instead of the gate control circuit 30 of the first embodiment. Further, it additionally has a programming circuit 32G. The rest of the configuration is the same as in the fifth embodiment.

The programming circuit 32G is constituted of the same circuit as the ROM circuit 32a of the fifth embodiment (FIG. 16) described above, and an internal fuse thereof is blown out in a manufacturing process of the pseudo SRAM, so that it outputs a setting signal SET1 of high level or low level. The gate control circuit 30G sets a high-level voltage line RDDRV at a boost voltage VPP or an internal power supply voltage VII in accordance with the logic of the setting signal SET1 from the programming circuit 32G. The DRAM is manufactured and shipped as any one of a plurality of kinds of products having different functions in accordance with a set value of the programming circuit 32C.

Figure 24:
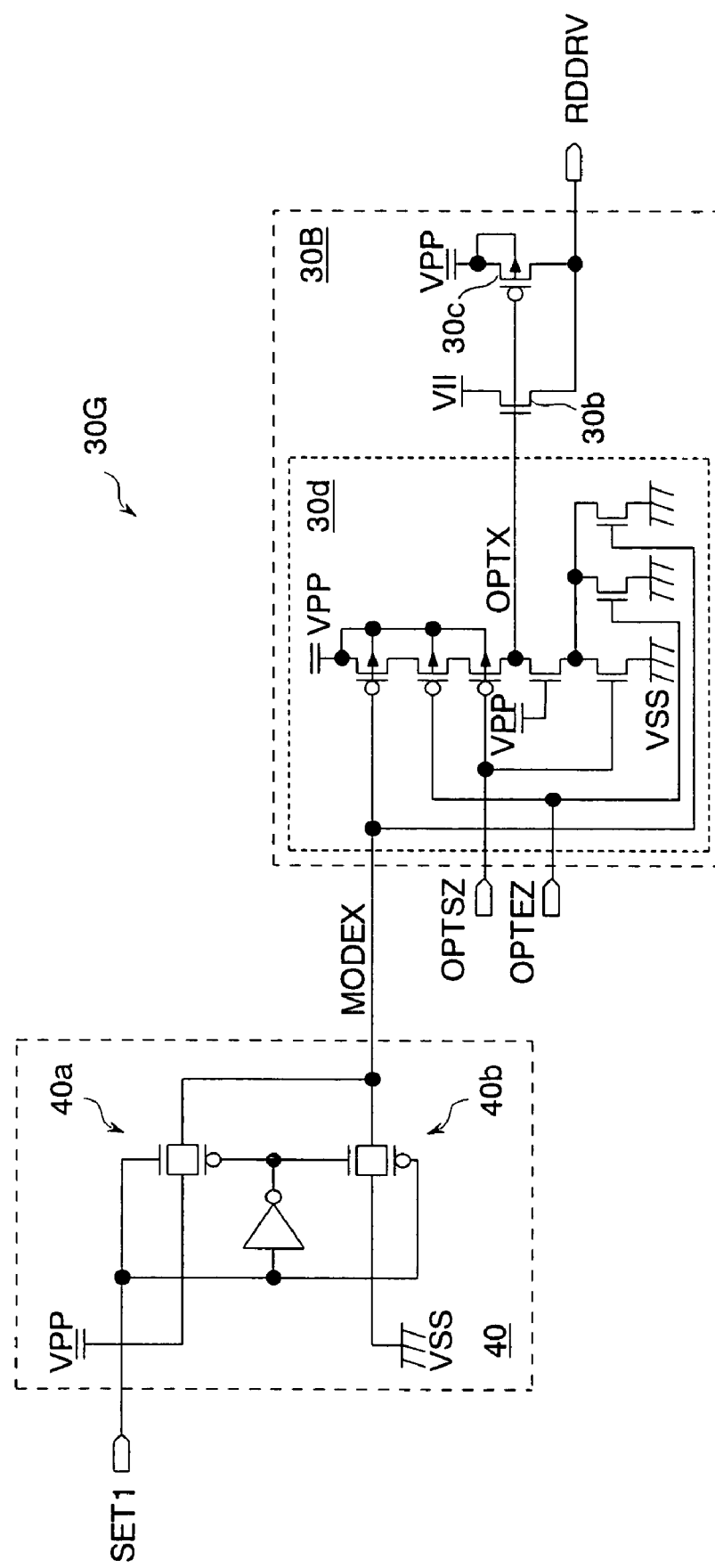
FIG. 24 is a circuit diagram showing the details of the gate control circuit shown in FIG. 23.

FIG. 24 shows the details of the gate control circuit 30G shown in FIG. 23. The gate control circuit 30G is constituted of the gate control circuit 30B of the third embodiment and a mode selector 40. An output node MODEX of the mode selector 40 is inputted to a NOR circuit 30d of the gate control circuit 30B along with an operation start signal OPTSZ and an operation end signal OPTEZ.

The mode selector 40 has a switch 40a that is ON while receiving the setting signal SET1 of high level, and a switch 40b that is ON while receiving the setting signal SET 1 of low level. The switches 40a, 40b are constituted of CMOS transmission gates. The mode selector 40 connects the output node MODEX to a boost voltage line VPP or a ground voltage line VSS in accordance with information set in the programming circuit 32G. When the output node MODEX is at a ground voltage VSS, the pseudo SRAM operates in the same manner as in the first embodiment. When the output node MODEX is at the boost voltage VPP, the high-level voltage line RDDRV is constantly set at the boost voltage VPP. At this time, the pseudo SRAM operates in the same manner as in the normal operation mode of the third embodiment.

Figure 25:
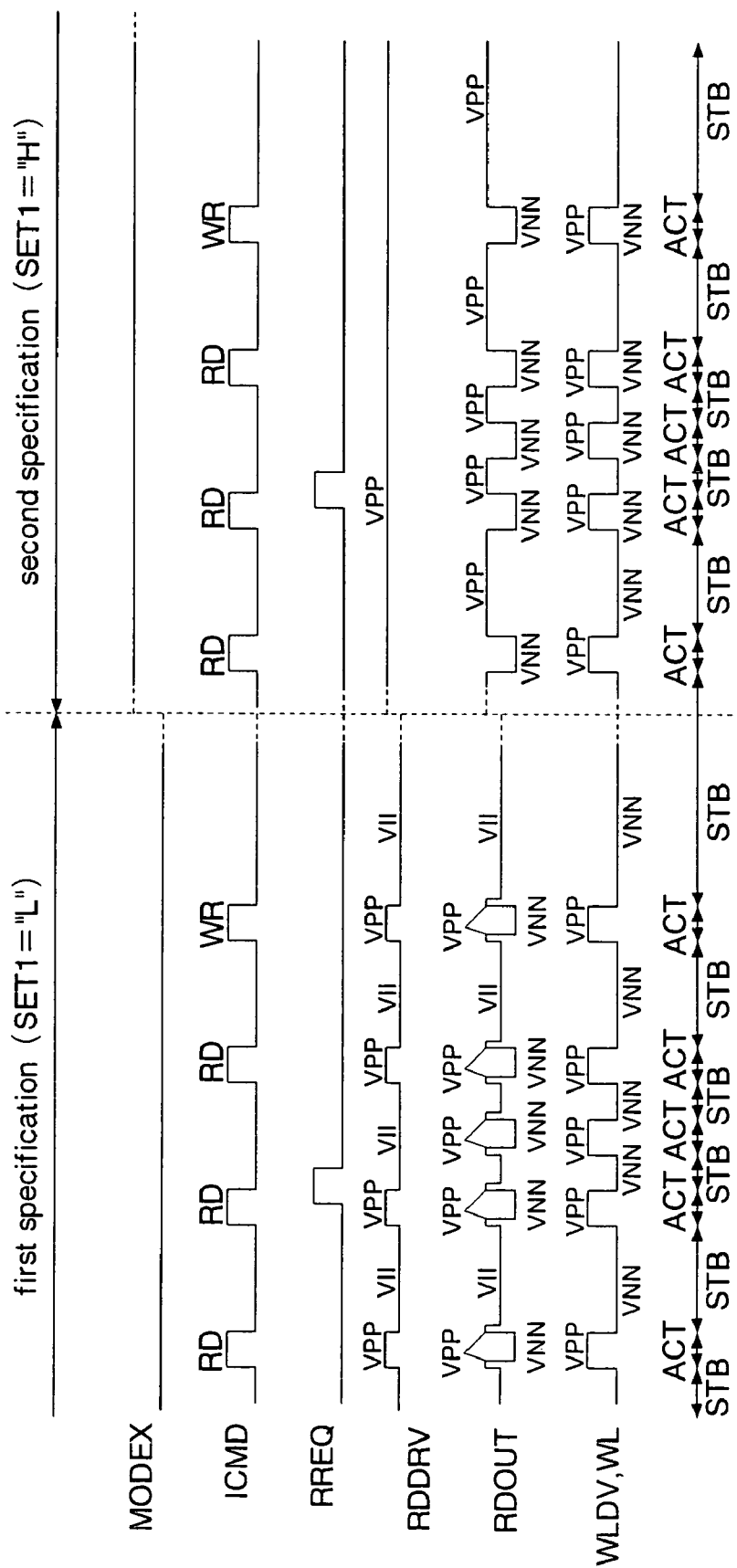
FIG. 25 is a timing chart showing an overview of operations of a pseudo SRAM in the eighth embodiment.

FIG. 25 shows an overview of operations of the pseudo SRAM in the eighth embodiment. When the setting signal SET1 is set at low level by the programming circuit 32G, the pseudo SRAM operates in the same manner as in the first embodiment. That is, the high-level voltage line RDDRV is set at the internal power supply voltage VII in standby periods STB and is set at the boost voltage VPP in active periods ACT.

When the setting signal SET1 is set at high level, the pseudo SRAM operates in the same manner as in the normal operation mode of the third embodiment except that the refresh request RREQ is not generated. This means that the high-level voltage line RDDRV is constantly set at the boost voltage VPP.

For example, a pseudo SRAM in which the setting signal SET1 is set at high level by the programming circuit 32G is mounted on a system which issues access requests at a high frequency. A pseudo SRAM in which the setting signal SET1 is set at low level by the programming circuit 32G is mounted on a system which issues access requests at a low frequency. It is possible to obtain the same effects as those of the fifth embodiment by thus manufacturing the pseudo SRAM in accordance with the characteristics of the system.

This embodiment can also provide the same effects as those of the first to fifth embodiments described above.

The foregoing first embodiment has dealt with the case where the present invention is applied to a pseudo SRAM chip. However, the present invention is not limited to such an embodiment. For example, the present invention may be applied to a system LSI that implements a pseudo SRAM core. The same holds true for the second embodiment.

The foregoing second embodiment has dealt with the case where the present invention is applied to a DRAM having an auto refresh function. However, the present invention is not limited to such an embodiment. For example, the present invention may be applied to a DRAM which receives a refresh command along with a refresh address.

The foregoing fifth and eighth embodiments have dealt with the case where the programming circuits 32, 32G are formed by using the fuses. However, the present invention is not limited to such embodiments. For example, the programming circuit may be formed by using memory cells of EEPROM or FeRAM instead of the fuses. In this case, it is possible to rewrite programmed information after the chip is manufactured, as in the mode register 36 of the sixth embodiment.

The foregoing fifth embodiment has dealt with the case where the present invention is applied to the DRAM having three kinds of the first specifications (the case where the setting signals SET10, SET01, SET00 are set to low level respectively). However, the present invention is not limited to such an embodiment. For example, the same effects are obtainable by applying the present invention to a DRAM in which any one of the three kinds of the first specifications is switchable to the second specification.

The invention is not limited to the above embodiments and various modifications may be made without departing from the spirit and scope of the invention. Any improvement may be made in part or all of the components.

What is claimed is:

1. A semiconductor memory comprising:
a memory array having a plurality of dynamic memory cells connected to a plurality of word lines, respectively;
a boost voltage generator for generating a constant boost voltage as a high-level voltage of said word lines by using an external supply voltage, the boost voltage being higher than the external supply voltage;
a plurality of first word decoders for decoding a first address signal in an active period during which said memory cells are accessed in response to an access request and a refresh request, outputting a low-level voltage when said first address signal indicates selection, outputting a high-level voltage when said first address signal indicates deselection, and outputting the high-level voltage in a standby period which is a period excluding said active period;
a switch circuit, while in operation in a first specification, connecting a high-level voltage line with a boost voltage line in a first period including at least said active period, and connecting the high-level voltage line with an internal voltage line in a period excluding the first period, the high-level voltage line being for supplying the high-level voltage to said first word decoders, the boost voltage line being an output node of said boost voltage generator, the internal voltage line being supplied with a voltage lower than the boost voltage; and
a plurality of word drivers formed in correspondence with said word lines, respectively, and each provided with a transistor, for outputting the boost voltage to said word lines when each transistor receives the low-level voltage at its gate from said first word decoders, and outputting the low-level voltage to said word lines when the each transistor receives the high-level voltage at its gate from said first word decoders.

2. The semiconductor memory according to claim 1, wherein:
said word drivers have CMOS inverters for inverting output levels of said first word decoders and outputting the inverted output levels to said word lines, respectively; and
the transistor of each of said word drivers is a pMOS transistor being a constituent of each of said CMOS inverters.

3. The semiconductor memory according to claim 2, comprising a second word decoder for decoding a second address signal in said active period, outputting the boost voltage to a source of said pMOS transistor when said second address signal indicates selection, and outputting the low-level voltage to said source when said second address signal indicates deselection, and wherein
the first period is said active period;
said period excluding the first period is said standby period; and
at the beginning of said active period, said second word decoder outputs the boost voltage after said switch circuit switches a voltage line to connect with the high-level voltage line from the internal voltage line to the boost voltage line.

4. The semiconductor memory according to claim 3, wherein
an output of said second word decoder is connected commonly to sources of pMOS transistors of said word drivers.

5. The semiconductor memory according to claim 3, wherein
said first address signal is composed of high-order bits of a row address signal composed of a plurality of bits to be used for selecting said word lines, and the second address signal is composed of low-order bits of the row address signal.

6. The semiconductor memory according to claim 2, comprising
a second word decoder for decoding a second address signal in said active period, outputting the boost voltage to a source of the pMOS transistor when said second address signal indicates selection, and outputting the low-level voltage to the source when said second address signal indicates deselection, and wherein
the first period is said active period;
said period excluding the first period is said standby period; and
at the end of said active period, said switch circuit switches the voltage line to connect with said high-level voltage line from the boost voltage line to the internal voltage line after said second word decoder outputs the low-level voltage.

7. The semiconductor memory according to claim 6, wherein
at the end of said active period, said switch circuit switches the voltage line to connect with the high-level voltage line from the boost voltage line to the internal voltage line after said first word decoders change their output voltages from a low level to a high level.

8. The semiconductor memory according to claim 6, wherein
said first address signal is composed of high-order bits of a row address signal composed of a plurality of bits to be used for selecting said word lines, and the second address signal is composed of low-order bits of the row address signal.

9. The semiconductor memory according to claim 2, comprising
a negative voltage generator for generating a constant negative voltage by using the external supply voltage, and wherein
nMOS transistors of said CMOS inverters receive the negative voltage at their sources.

10. The semiconductor memory according to claim 1, comprising an internal power supply voltage generator for generating a constant internal supply voltage by using the external supply voltage, the internal supply voltage being lower than the external supply voltage.

11. The semiconductor memory according to claim 1, wherein:
said word drivers have CMOS inverters for inverting output levels of said first word decoders and outputting the inverted output levels to said word lines, respectively;
the transistor of each of said word drivers is a pMOS transistor being a constituent of each of said CMOS inverters, said pMOS transistor receiving said boost voltage at its substrate;
said boost voltage generator has a comparison control circuit for comparing the boost voltage and a reference voltage, and performing a boost operation during a period when the boost voltage is lower than the reference voltage; and
said comparison control circuit continues to perform the comparing operation during said active period and said standby period.

12. The semiconductor memory according to claim 1, comprising:
a command decoder for decoding a read command and a write command which are access requests supplied through an external terminal;
a refresh control circuit for generating a refresh command being the refresh request at predetermined intervals; and
an operation control circuit for outputting a timing signal for operating said memory array, in order to perform an access operation in response to said read command and said write command and a refresh operation in response to said refresh command, wherein
said operation control circuit has an arbiter for determining which of said access operation and refresh operation is given priority, when said read or write command and said refresh command conflict with each other.

13. The semiconductor memory according to claim 1, comprising:
a command decoder for decoding a read command and a write command which are said access requests and supplied through an external terminal during a normal operation mode;
a refresh control circuit for generating a refresh command being said refresh request at predetermined intervals during a self-refresh mode in which none of said access requests is accepted; and
an operation control circuit for outputting a timing signal for operating said memory array, in order to perform an access operation in response to said read command and write command and a refresh operation in response to said refresh command.

14. The semiconductor memory according to claim 1, wherein:

the semiconductor memory has, as operation modes, a normal operation mode in which the access request is accepted and a self-refresh mode in which the access request is not accepted and only a refresh operation is executed in response to the refresh request generated inside the semiconductor memory;
the first period is an active period in the self-refresh mode and a period of the normal operation mode; and
said period excluding the first period is a standby period in the self-refresh mode.

15. The semiconductor memory according to claim 1, wherein:
the semiconductor memory has, as operation modes, a normal operation mode in which the access request and the refresh request are accepted, and a power-down mode in which neither the access request nor the refresh request is accepted; and
the first period is a period of the normal operation mode and the period excluding the first period is a period of the power-down mode.

16. The semiconductor memory according to claim 1, further comprising
a programming circuit for setting an operating specification of the semiconductor memory to one of the first specification and a second specification, and wherein
said switch circuit continues to connect the high-level voltage line to the boost voltage line when a set value of said programming circuit indicates the second specification.

17. The semiconductor memory according to claim 1, further comprising
a mode register for setting an operating specification of the semiconductor memory to one of the first specification and a second specification, and wherein
said switch circuit continues to connect the high-level voltage line to the boost voltage line when a set value of said mode register indicates the second specification.

18. The semiconductor memory according to claim 1, wherein:
an operating specification of the semiconductor memory is set to one of the first specification and a second specification according to a voltage of a destination to which a conductive film is connected, the conductive film formed at a predetermined position over a semiconductor substrate so as to match with a pattern shape of a photomask used in a semiconductor manufacturing process; and
said switch circuit continues to connect the high-level voltage line to the boost voltage line when the voltage of the destination of said conductive film indicates the second specification.

* * * * *